(12) United States Patent
Jeon et al.

(10) Patent No.: US 11,647,656 B2
(45) Date of Patent: May 9, 2023

(54) DISPLAY APPARATUS

(71) Applicant: Samsung Display Co., Ltd., Yongin-si (KR)

(72) Inventors: Byeongguk Jeon, Yongin-si (KR); Keunsoo Lee, Yongin-si (KR); Youngjin Cho, Yongin-si (KR); Deokyoung Choi, Yongin-si (KR); Yangwan Kim, Yongin-si (KR); Jinyup Kim, Yongin-si (KR); Hagyeong Song, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 142 days.

(21) Appl. No.: 17/136,693

(22) Filed: Dec. 29, 2020

(65) Prior Publication Data
US 2021/0335986 A1   Oct. 28, 2021

(30) Foreign Application Priority Data

Apr. 23, 2020  (KR) ........................ 10-2020-0049481

(51) Int. Cl.
*H01L 27/32* (2006.01)
*H01L 51/52* (2006.01)

(52) U.S. Cl.
CPC ........ *H01L 27/3276* (2013.01); *H01L 27/323* (2013.01); *H01L 51/5253* (2013.01)

(58) Field of Classification Search
CPC ............... H01L 27/3276; H01L 27/323; H01L 51/5253; H01L 27/1255; H01L 27/3262; H01L 27/1248; H01L 27/1244; H01L 27/3244; H01L 27/124; H01L 51/5206; H01L 51/5246; G06F 3/0445; G06F 3/0412

See application file for complete search history.

(56) References Cited

U.S. PATENT DOCUMENTS

| | | | |
|---|---|---|---|
| 6,366,331 B1 | 4/2002 | Sakamoto et al. |
| 9,996,205 B2 | 6/2018 | Kang et al. |
| 10,210,798 B2 | 2/2019 | Kim et al. |
| 10,566,395 B2 | 2/2020 | Lee et al. |
| 2002/0053668 A1 | 5/2002 | Kim |

(Continued)

FOREIGN PATENT DOCUMENTS

| | | |
|---|---|---|
| EP | 3 301 547 | 4/2018 |
| GB | 2 323 475 | 9/1998 |

(Continued)

OTHER PUBLICATIONS

Partial European search report for European Patent Application or Patent No. 21169809.7 dated Sep. 8, 2021.

*Primary Examiner* — Kyoung Lee
(74) *Attorney, Agent, or Firm* — Kile Park Reed & Houtteman PLLC

(57) ABSTRACT

A display apparatus includes a substrate including a display area, a non-display area adjacent to the display area, and a pad area arranged in the non-display area; a display portion arranged in the display area and including pixels; a pad portion arranged in the pad area and including pads; and an insulating layer overlapping an edge of each of the pads and exposing a central portion of each of the pads, wherein the insulating layer includes at least one opening arranged between adjacent ones of the pads.

27 Claims, 20 Drawing Sheets

(56) References Cited

U.S. PATENT DOCUMENTS

| | | | |
|---|---|---|---|
| 2002/0071086 A1 | 6/2002 | Kim et al. | |
| 2003/0020847 A1 | 1/2003 | Kim et al. | |
| 2006/0181218 A1* | 8/2006 | Jung | G02F 1/13458 |
| | | | 313/631 |
| 2007/0035239 A1 | 2/2007 | Kang et al. | |
| 2007/0268442 A1 | 11/2007 | Oh et al. | |
| 2014/0225071 A1 | 8/2014 | Park et al. | |
| 2015/0188083 A1 | 7/2015 | Jang | |
| 2015/0268775 A1 | 9/2015 | Yu et al. | |
| 2016/0020422 A1 | 1/2016 | Kim et al. | |
| 2016/0306472 A1* | 10/2016 | Park | H01L 51/5256 |
| 2017/0012056 A1 | 1/2017 | Lee | |
| 2018/0061895 A1 | 3/2018 | Kim et al. | |
| 2021/0223654 A1 | 7/2021 | Li et al. | |

FOREIGN PATENT DOCUMENTS

| | | |
|---|---|---|
| KR | 2003-0042079 | 5/2003 |
| KR | 10-2017-0080971 | 7/2017 |
| KR | 10-2018-0005097 | 1/2018 |
| KR | 10-2018-0133706 | 12/2018 |
| KR | 10-1945439 | 2/2019 |
| KR | 10-2013384 | 8/2019 |
| WO | 2019/007086 | 1/2019 |

* cited by examiner

DISPLAY APPARATUS

CROSS-REFERENCE TO RELATED APPLICATION(S)

This application claims priority to and benefits of Korean Patent Application No. 10-2020-0049481 under 35 U.S.C. § 119, filed on Apr. 23, 2020, in the Korean Intellectual Property Office, the entire contents of which are incorporated herein by reference.

BACKGROUND

1. Technical Field

One or more embodiments relate to a display apparatus, and, to a display apparatus in which the reliability in a pad area is improved.

2. Description of the Related Art

A display apparatus is an apparatus for visually displaying data. Recently, usage of display apparatuses has diversified. As display apparatuses have become thinner and lighter, their range of use has gradually been extended.

A display apparatus may be divided into a display area and a peripheral area outside of the display area. Pixels may be arranged or disposed in the display area, and each of the pixels may include an organic light-emitting diode and a pixel circuit, the pixel circuit being electrically connected to the organic light-emitting diode. Various wirings, a scan driver, a data driver, a controller, for example, each transferring an electric signal to the display area may be provided or disposed in the peripheral area.

A pad area may be provided or disposed on one or a side of the peripheral area to transfer an electric signal to the display area, wherein pads electrically connected to an end of the wirings may be arranged or disposed in the pad area.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display apparatus in which the reliability in a pad area may be improved. However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments of the disclosure.

According to one or more embodiments, a display apparatus may include a substrate including a display area; a non-display area adjacent to the display area; and a pad area arranged in the non-display area; a display portion arranged in the display area and including pixels; a pad portion arranged in the pad area and including pads; and an insulating layer overlapping an edge of each of the pads and exposing a central portion of each of the pads, wherein the insulating layer may include at least one opening arranged between adjacent ones of the pads.

The pads may be arranged in a first direction and a second direction intersecting the first direction, and the insulating layer may include a first opening arranged between the pads arranged in the first direction, the first opening extending in the second direction.

The pads may be arranged in a first direction and a second direction intersecting the first direction, and the insulating layer may include a second opening arranged between the pads arranged in the second direction, the second opening extending in the first direction.

The insulating layer may further include a second opening arranged between the pads arranged in the second direction.

The first opening may have a first length extending in the second direction, and the first length may be the same as a length of each of the pads in the second direction.

The first opening may have a first width in the first direction, and the first width may be in a range of about 20% to about 45% of a width of each of the pads in the first direction.

The second opening may have a second length extending in the first direction, and the second length may be less than the first length.

The second opening may have a second width in the second direction, and the second width may be the same as the first width.

The second opening may have a second width in the second direction, and the second width may be different from the first width.

The second opening may have a second length extending in the first direction, and the second length may be greater than the first length.

Each of the pads may include a first conductive layer arranged on the substrate; a first inorganic insulating layer overlapping the first conductive layer and including a first contact hole exposing at least a portion of the first conductive layer; a second conductive layer arranged on the first inorganic insulating layer and electrically connected to the first conductive layer through the first contact hole; and a third conductive layer arranged on the second conductive layer.

The insulating layer may clad an edge of the third conductive layer.

At least a portion of the first inorganic insulating layer may be exposed through the at least one opening of the insulating layer.

The display apparatus may further include a display element arranged in the display area; a thin film transistor arranged between the substrate and the display element; and a connection electrode electrically connecting the display element to the thin film transistor, wherein the thin film transistor may include a semiconductor layer; a gate electrode at least partially overlapping the semiconductor layer; and an electrode layer arranged over the gate electrode and electrically connected to the semiconductor layer, and the third conductive layer and the connection electrode may include a same material.

The first conductive layer and the gate electrode may include a same material, and the second conductive layer and the electrode layer may include a same material.

The display apparatus may further include an organic insulating layer arranged between the connection electrode and a pixel electrode of the display element and including a via hole through which the pixel electrode may be connected to the connection electrode, wherein the insulating layer and the organic insulating layer may include a same material.

The display element may include a pixel electrode, an opposite electrode, and an intermediate layer arranged between the pixel electrode and the opposite electrode, and the pixel electrode may include silver (Ag).

Each of the pads may further include a second inorganic insulating layer overlapping the third conductive layer and the insulating layer and including a second contact hole exposing at least a portion of the third conductive layer; and a fourth conductive layer arranged on the first inorganic insulating layer and electrically connected to the third conductive layer through the second contact hole.

The display apparatus may further include a thin-film encapsulation layer arranged on the display portion and including at least one organic encapsulation layer and at least one inorganic encapsulation layer; and a touch sensing layer arranged on the thin-film encapsulation layer, wherein the touch sensing layer may include a first touch electrode layer; a second touch electrode layer on the first touch electrode layer; and an inorganic layer arranged between the first touch electrode layer and the second touch electrode layer, and the fourth conductive layer and the second touch electrode layer may include a same material.

The display apparatus may further include a thin-film encapsulation layer arranged on the display portion and including at least one organic encapsulation layer and at least one inorganic encapsulation layer, and a touch sensing layer arranged on the thin-film encapsulation layer.

The pad portion may include a first sub-pad portion including first pads that transfer an electric signal to the display portion, and a second sub-pad portion including second pads that transfer an electric signal to the touch sensing layer.

The at least one opening of the insulating layer may be arranged except between the second pads of the second sub-pad portion.

The insulating layer may include an organic insulating material.

A thickness of the insulating layer may be in a range of about 6000 Å to about 8000 Å.

According to one or more embodiments, a display apparatus may include a substrate including a display area and a peripheral area adjacent to the display area; a display portion arranged in the display area and including pixels; a driving circuit portion arranged in the peripheral area and transferring a driving signal to the display portion; a pad portion arranged in the peripheral area and including pads; and an insulating layer overlapping an edge of each of the pads and exposing a central portion of each of the pads, wherein at least a portion of the insulating layer arranged between adjacent ones of the pads may be removed.

The pad portion may further include a first sub-pad portion including first pads that transfer an electric signal to the display portion, and the insulating layer may include at least one first opening arranged between the first pads of the first sub-pad portion.

The display apparatus may further include a touch sensing layer arranged on the display portion; and a second sub-pad portion including second pads that transfer an electric signal to the touch sensing layer, wherein the insulating layer may be arranged between the second pads of the second sub-pad portion.

These and/or other aspects will become apparent and more readily appreciated from the following description of the embodiments, the accompanying drawings, and claims.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
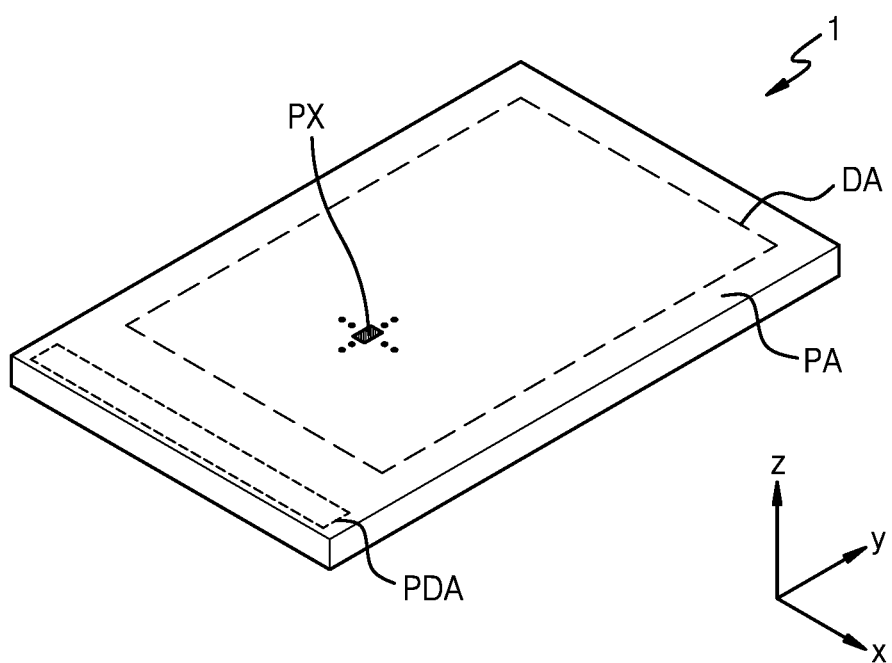
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. Throughout the disclosure, the expression "at least one of a, b or c" indicates only a, only b, only c, both a and b, both b or c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

As the disclosure allows for various changes and numerous embodiments, embodiments will be illustrated in the drawings and described in detail in the written description. Effects and characteristics of the disclosure, and a method of accomplishing the same will become apparent and more readily appreciated from the following description of the embodiments and the accompanying drawings. However, the disclosure is not limited to embodiments below and may be implemented in various forms.

Hereinafter, embodiments are described in detail with reference to the accompany drawings. When description is made with reference to the drawings, like reference numerals are given to like or corresponding elements, and repeated descriptions thereof are omitted.

It will be understood that although the terms "first," "second," etc. may be used herein to describe various components, these components should not be limited by these terms. These components are only used to distinguish one component from another. For example, a first element referred to as a first element in one embodiment may be referred to as a second element in another embodiment without departing from the scope of the appended claims.

As used herein, the singular forms "a," "an," and "the" are intended to include the plural forms as well, unless the context clearly indicates otherwise.

It will be further understood that the terms "comprises" and/or "comprising", "includes" and/or "including", "have" and/or "having" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. For example, intervening layers, regions, or components may be present.

Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

It will be understood that when a layer, region, or component is referred to as being "connected" to another layer, region, or component, it may be "directly connected" to the other layer, region, or component and/or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component and/or may be "indirectly electrically connected" to other layer, region, or component with other layer, region, or component interposed therebetween.

In the specification, "A and/or B" means A or B, or A and B. In the specification, "at least one of A and B" means A or B, or A and B.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

In embodiments below, when a component is referred to as being "on a plane," it is understood that a component is viewed from the top, and when a component is referred to as being "on a schematic cross section," it is understood that the component is vertically cut and viewed from the side.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an embodiment may be implemented differently, a specific process order may be performed differently from the described order. For example, two consecutively described processes may be performed substantially at the same time or performed in an order opposite to the described order.

Sizes of elements in the drawings may be exaggerated or reduced for convenience of explanation. In other words, since sizes and thicknesses of components in the drawings are arbitrarily illustrated for convenience of explanation, the following embodiments are not limited thereto.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of a display apparatus 1 according to an embodiment.

Referring to FIG. 1, the display apparatus 1 may include a display area DA and a peripheral area PA, an image being displayed on the display area DA, and the peripheral area PA being a non-display area on which an image may not be displayed. The peripheral area PA, or the non-display area, may be outside of or may be adjacent to the display area DA. The display apparatus 1 may display an image to the outside by using light emitted from pixels PX arranged or disposed in the display area DA. The peripheral area PA may include a pad area PDA on at least one or a side thereof.

Though FIG. 1 shows the display apparatus 1 in which the display area DA is approximately a quadrangle, but the embodiment is not limited thereto. The shape of the display area DA may include a circle, an ellipse, or a polygon such as a triangle, a quadrangle, and a pentagon. In an embodiment, the display area DA may have an approximately rectangular shape having approximately round edges and may have a shape in which a notch may be formed in one or a side thereof.

Although it is shown in FIG. 1 that the display apparatus 1 may include a flat-panel display apparatus having an approximately flat shape, the display apparatus 1 may be implemented in various types such as flexible, bendable, foldable, and rollable display apparatuses. In the case where the display apparatus 1 may be implemented as a flexible, bendable, or foldable display apparatus, a portion or all of the display area DA may be implemented as a flexible, bendable, or foldable display area.

Figure 3A:
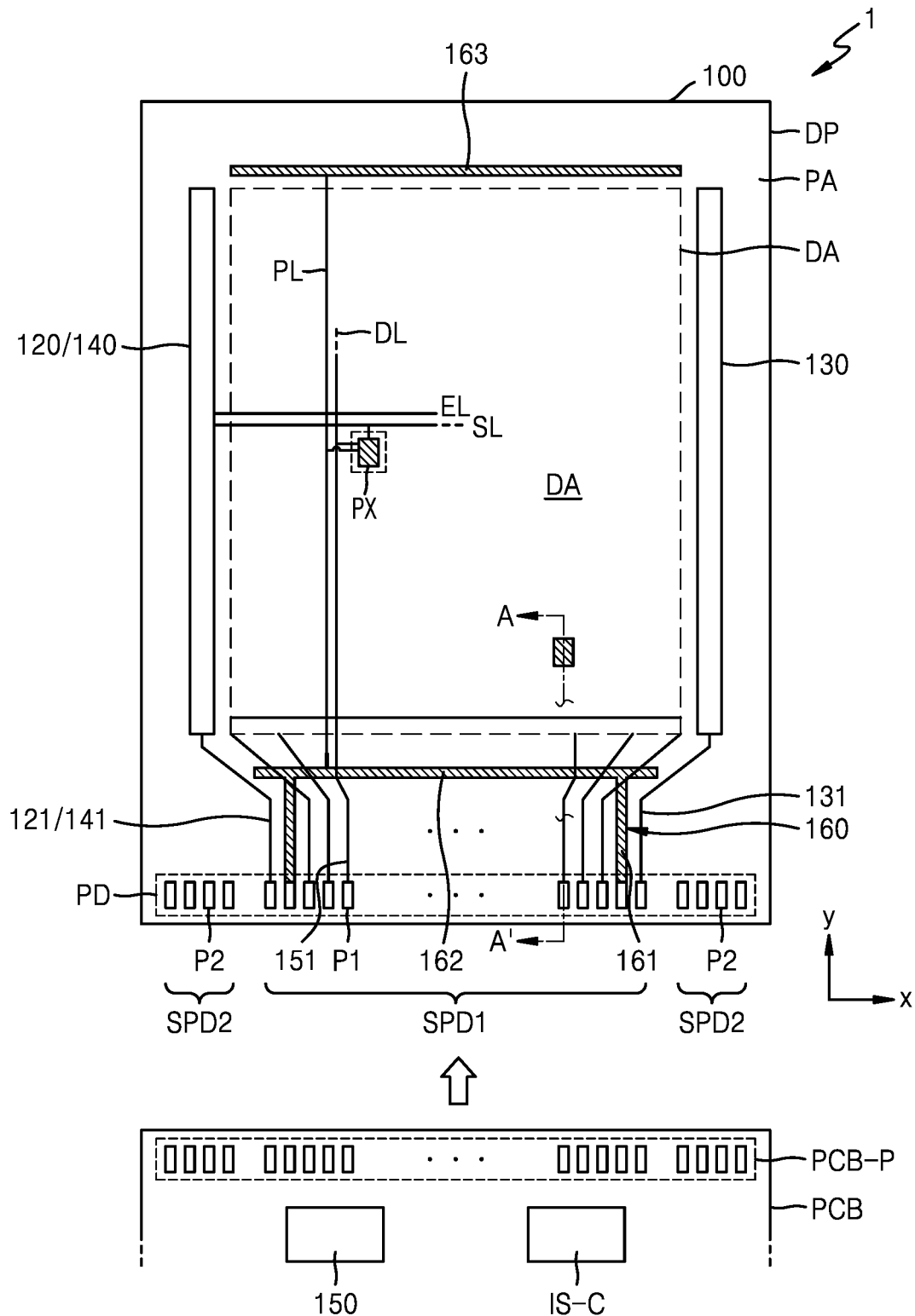
FIGS. 3A and 3B are plan views of a display apparatus according to an embodiment.
Figure 3B:
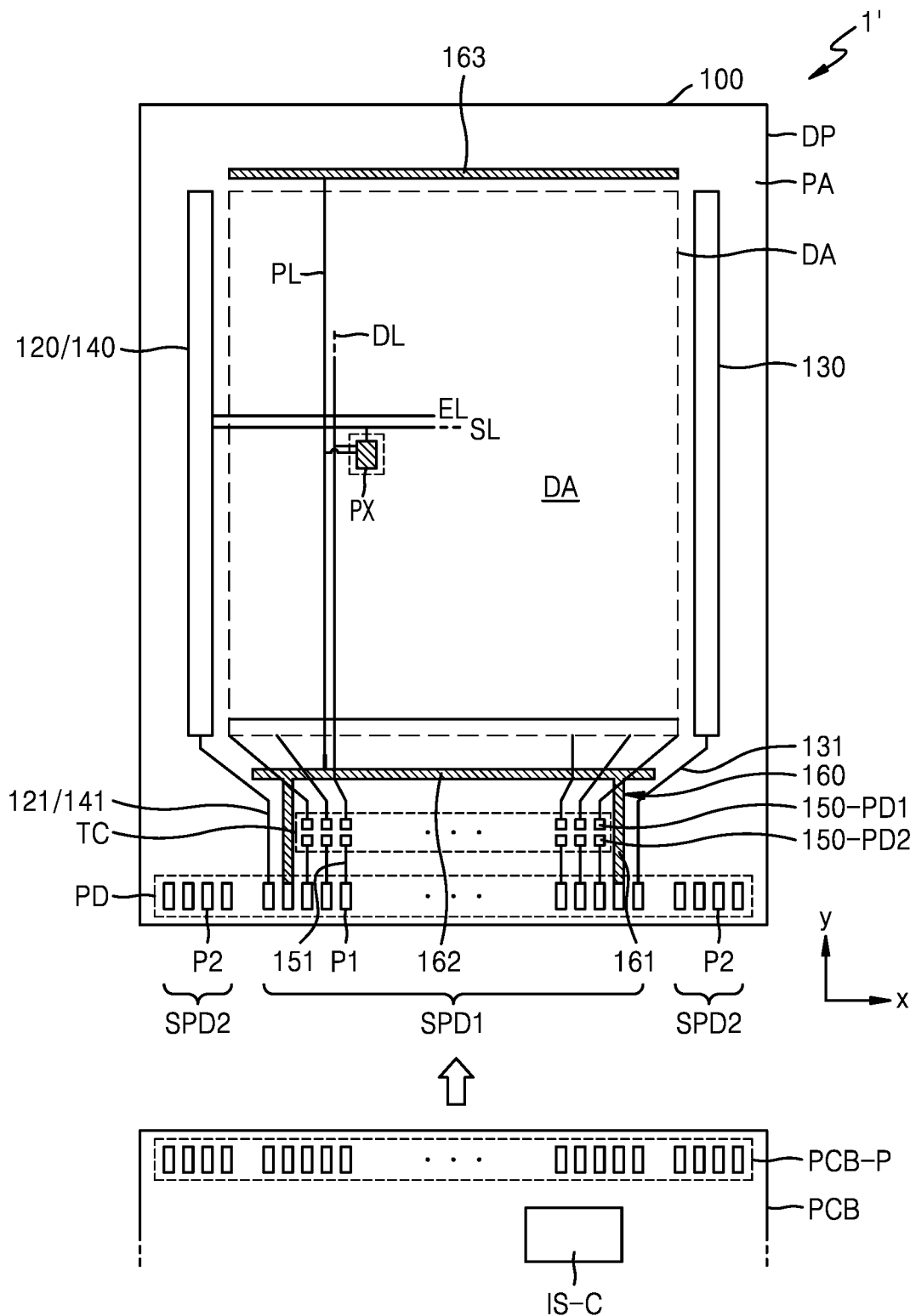

Though not shown, the display apparatus 1 may include a component (not shown) arranged or disposed on one or a side of a display panel DP (see FIGS. 3A and 3B). The component may include an electronic element that uses light or sound. For example, the electronic element may include a sensor such as an infrared sensor that emits and/or receives light, a camera that receives light to capture an image, a sensor that outputs and senses light or sound to measure a distance or recognize a fingerprint, a small lamp that outputs light, and a speaker that outputs sound.

Though an organic light-emitting display apparatus is described as the display apparatus 1 according to an embodiment as an example, the embodiment is not limited thereto. In an embodiment, the display apparatus 1 according to an embodiment may include display apparatuses such as inorganic light-emitting displays or quantum-dot light-emitting displays. For example, an emission layer of a display element of the display apparatus 1 may include an organic material, an inorganic material, quantum dots, an organic material and quantum dots, or an inorganic material and quantum dots.

Figure 2:
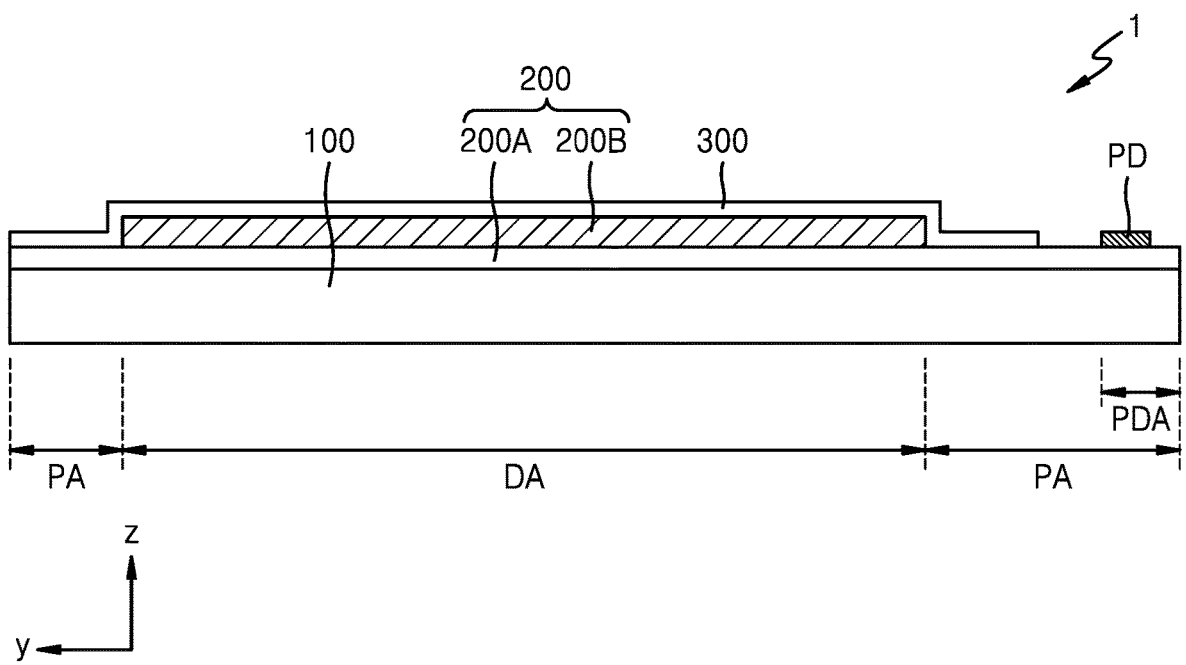
FIG. 2 is a schematic cross-sectional view of a display apparatus according to an embodiment.

FIG. 2 is a schematic cross-sectional view of the display apparatus 1 according to an embodiment.

Referring to FIG. 2, the display apparatus 1 may include a substrate 100, a pixel circuit layer 200A, a display element layer 200B, a thin-film encapsulation layer 300, and a touch sensing layer 400 (see FIGS. 5A and 5B) disposed on the substrate 100. Though not shown separately, the display apparatus 1 may include functional layers such as a reflection prevention layer and a refractive index adjusting layer.

The substrate 100 may include a synthetic resin film. A synthetic resin layer may be formed or disposed on a work substrate used while the display apparatus 1 is manufactured. A conductive layer and an insulating layer may be formed or disposed on the synthetic resin layer. In a case that the work substrate is removed, the synthetic resin layer may correspond to the substrate 100. The synthetic resin layer may include a polyimide-based resin layer, and a material thereof is not particularly limited. In an embodiment, the substrate 100 may include a glass substrate, a metal substrate, or an organic/inorganic composite material substrate.

A display portion 200 may include the pixel circuit layer 200A and the display element layer 200B.

The pixel circuit layer 200A may include at least one insulating layer and a circuit element. The insulating layer may include at least one inorganic layer and at least one organic layer. The circuit element may include a signal line and a driving circuit of a pixel. The pixel circuit layer 200A may be formed through a process of forming an insulating layer using coating and deposition, a semiconductor layer, and a conductive layer, an insulating layer using a photolithography process, and a patterning process of a semiconductor layer and a conductive layer.

The display element layer 200B may include a display element such as an organic light-emitting diode. The display element layer 200B may include an organic layer such as a pixel-defining layer.

The thin-film encapsulation layer 300 may seal the display element layer 200B. The thin-film encapsulation layer 300 may include at least one insulating layer. The thin-film encapsulation layer 300 according to an embodiment may include at least one inorganic layer (referred to as an inorganic encapsulation layer hereinafter). The thin-film encapsulation layer 300 according to an embodiment may include at least one organic layer (referred to as an organic encapsulation layer hereinafter) and at least one inorganic encapsulation layer. The inorganic encapsulation layer may protect the display element layer 200B from moisture/oxygen, and the organic encapsulation layer may protect the display element layer 200B from foreign substances such as dust particles.

The touch sensing layer 400 may be arranged or disposed on the thin-film encapsulation layer 300. In an embodiment, the touch sensing layer 400 may be directly arranged or disposed on the thin-film encapsulation layer 300. In a case that the touch sensing layer 400 is directly arranged or disposed on the thin-film encapsulation layer 300, it may mean that the touch sensing layer 400 may be arranged or disposed to directly contact the thin-film encapsulation layer 300 without a separate adhesive layer between the touch sensing layer 400 and the thin-film encapsulation layer 300. In this case, the touch sensing layer 400 may be directly formed or disposed on the thin-film encapsulation layer 300 through a successive process after the thin-film encapsulation layer 300 may be formed. In an embodiment, the touch sensing layer 400 may include an approximate panel shape having a separate base layer corresponding to the substrate and may be attached to the thin-film encapsulation layer 300 with an adhesive layer therebetween.

The peripheral area PA may include the pad area PDA on one or a side thereof. A pad portion PD including pads may be arranged or disposed in the pad area PDA. Each of the pads of the pad portion PD may electrically contact pads of a printed circuit board PCB described below to receive a signal input through the printed circuit board PCB. The pad portion PD is described below in detail.

FIGS. 3A and 3B are plan views of the display apparatus 1 according to an embodiment.

Referring to FIG. 3A, the display apparatus 1 may include pixels PX arranged or disposed in the display area DA of the substrate 100. A pixel PX may include a display element such as an organic light-emitting diode OLED. The pixel PX may be provided in plural and may emit, for example, red, green, blue, or white light from the organic light-emitting diode OLED. In an embodiment, the pixel PX substantially denotes a sub-pixel. In the display area DA, at least one pixel PX may be grouped to constitute one unit pixel.

The pixel PX may be electrically connected to driving circuits arranged or disposed in the peripheral area PA. A first scan driving circuit 120, a second scan driving circuit 130, an emission control driving circuit 140, and a first power supply line 160 may be arranged or disposed in the peripheral area PA.

The first scan driving circuit 120 and the second scan driving circuit 130 may provide a scan signal to each pixel PX through a scan line SL. The second scan driving circuit 130 may be arranged or disposed in parallel to the first scan driving circuit 120 with the display area DA therebetween. Some or a predetermined number of the pixels PX arranged or disposed in the display area DA may be electrically connected to the first scan driving circuit 120, and the rest or predetermined number of the pixels PX may be electrically connected to the second scan driving circuit 130. In an embodiment, the second scan driving circuit 130 may be omitted.

The emission control driving circuit 140 may be arranged or disposed on one or a side of the display area DA. The emission control driving circuit 140 may provide an emission control signal EM to each pixel through an emission control line EL.

The pad portion PD may be arranged or disposed on one or a side of the substrate 100. The pad portion PD may include pads P. The pads P may be exposed and electrically connected to the printed circuit board PCB by not being covered or overlapped by an insulating layer. A pad portion PCB-P of the printed circuit board PCB may be electrically connected to the pad portion PD of the display apparatus 1. The printed circuit board PCB may include a rigid circuit board or a flexible circuit board. The printed circuit board PCB may be directly coupled or connected to a display panel DP, or electrically connected to the display panel DP through another circuit board.

In an embodiment, a data driving circuit 150 may be arranged or disposed on the printed circuit board PCB, the data driving circuit 150 controlling an operation of the display panel DP. An input sensing circuit IS-C may be arranged or disposed on the printed circuit board PCB, the input sensing circuit IS-C controlling the touch sensing layer 400. In an embodiment of FIG. 3A, the data driving circuit 150 and the input sensing circuit IS-C may be mounted or disposed on the printed circuit board PCB in the form of one integrated chip. The printed circuit board PCB may include the pad portion PCB-P of the circuit board that may be electrically connected to the display panel DP. Though not shown, the printed circuit board PCB may include a signal line electrically connecting the pad portion PCB-P of the circuit board to the data driving circuit 150 and/or the input sensing circuit IS-C.

The first power supply line 160 may include a first sub-line 162 and a second sub-line 163 extending in parallel to each other in a first direction (for example an x-direction) with the display area DA therebetween (FIG. 3B) and supply a first power voltage ELVDD through a power transfer line 161 extending in a second direction (for example a y-direction). The first power voltage ELVDD may be provided to a pixel circuit of each pixel PX through a driving voltage line PL electrically connected to the first power supply line 160. Though not shown, a second power supply line may be arranged or disposed in the peripheral area PA, the second power supply line partially surrounding or adjacent to the display area DA. The second power supply line may have an approximately loop shape that may be open to the pad portion PD. A second power voltage ELVSS may be transferred to the second power supply line. The second power voltage ELVSS may be provided to an opposite electrode of each pixel PX electrically connected to the second power supply line.

Figure 6:
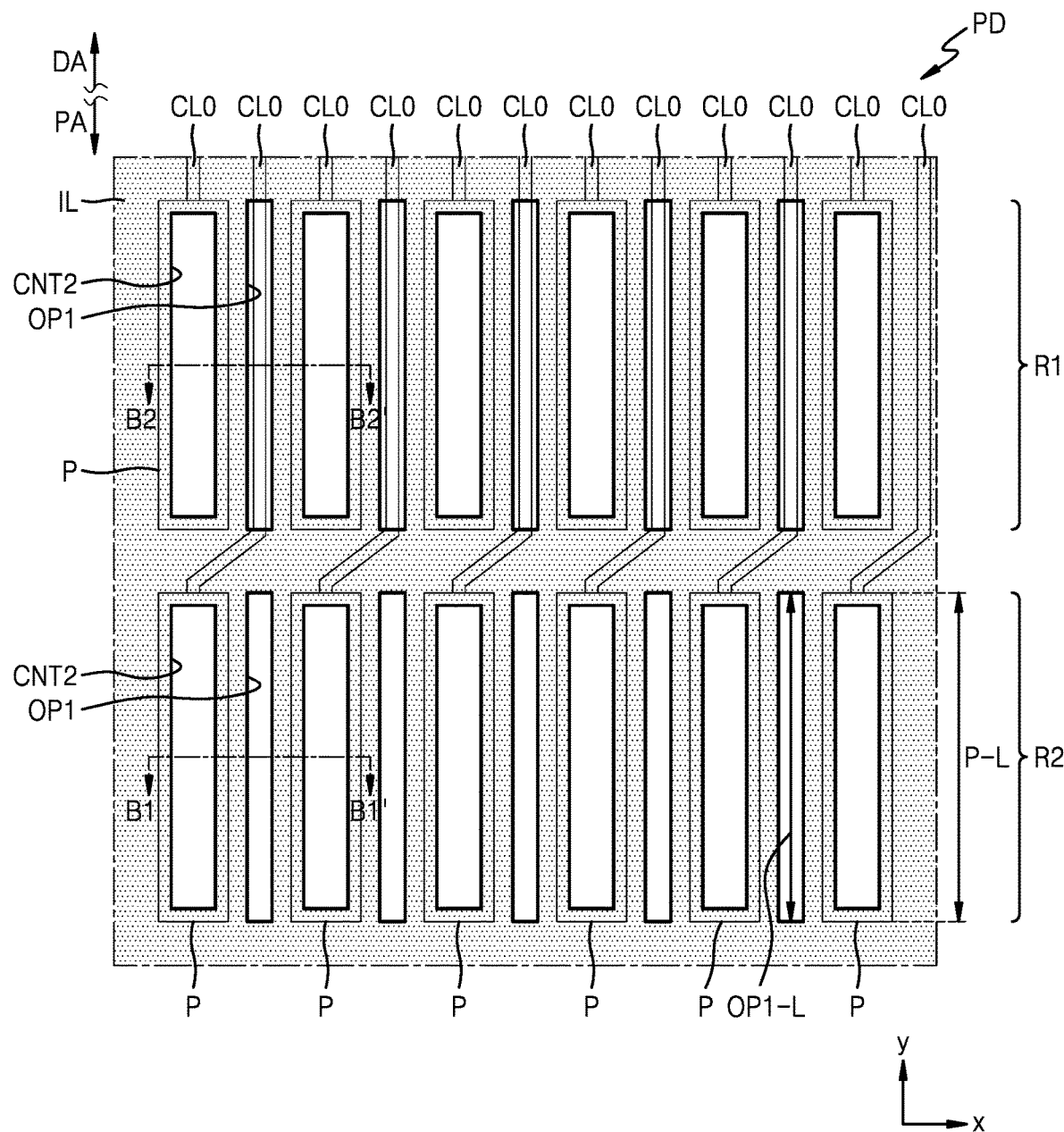
FIG. 6 is an enlarged plan view of a portion or region of a pad portion in a display apparatus according to an embodiment.

The pad portion PD may include pads P1 and P2 successively arranged or disposed and spaced apart from each other with a predetermined interval. Though it is shown in FIG. 3A that the pads P1 and P2 may be arranged or disposed in the first direction (for example the x-direction), for convenience of description, the pads P1 and P2 may be arranged or disposed along rows in the first direction (for example the x-direction) and along columns in the second direction (for example the y-direction) as shown in FIG. 6 below.

The pad portion PD may include a first sub-pad portion SPD1. The first sub-pad portion SPD1 may include first pads P1 that transfer an electric signal to the display portion 200. The first pads P1 may be electrically connected to an end terminal of a signal transfer line 151 of a data line DL that may extend to the peripheral area PA. Some or predetermined number of the first pads P1 may be electrically connected to signal transfer lines 121, 131, and 141 and an end terminal of the power transfer line 161, the signal transfer lines 121, 131, and 141 being electrically connected to the first scan driving circuit 120, the second scan driving circuit 130, and the emission control driving circuit 140, and the power transfer line 161 being electrically connected to the first power supply line 160.

The pad portion PD may include second sub-pad portions SPD2 respectively arranged or disposed on two opposite sides with the first sub-pad portion SPD1 disposed therebetween. The second sub-pad portion SPD2 may include second pads P2 that may transfer an electric signal to the touch sensing layer 400. In an embodiment, the second pads P2 may include dummy pads. Because the second pads P2 may be formed through the same process as a process of forming the first pads P1, the second pads P2 may have approximately the same dimensions, shapes, sizes, lengths or widths as the first pads P1.

The second pads P2 may be selectively provided or disposed in a case where the touch sensing layer 400 may be directly provided or disposed on the thin-film encapsulation layer 300 as in an embodiment. In a case where the touch sensing layer 400 may be provided in a separate panel shape and attached or disposed on the thin-film encapsulation layer 300, the second pads P2 may be omitted. The second pads P2 may be provided as floating electrodes and electrically insulated from signal lines electrically connected to the pixel PX. The second pads P2 may overlap the pad portion of the touch sensing layer 400.

A display apparatus 1' of FIG. 3B may be mostly the same as the display apparatus 1 of FIG. 3A but may be different from the display apparatus 1 of FIG. 3A in that the data driving circuit 150 may be directly arranged or disposed on the substrate 100 of the display panel DP, not the printed circuit board PCB. As described above, the data driving circuit 150 may be provided in a chip type. In FIG. 3B, first chip pads 150-PD1 and second chip pads 150-PD2 may be provided or disposed on a portion in which the data driving circuit 150 may be mounted. Each of the first chip pads 150-PD1 may be electrically connected to the data line DL, and the second chip pads 150-PD2 may be electrically connected to the first pads P1 through the signal transfer lines 121, 131, and 141. The data driving circuit 150 may be electrically connected to first chip pads 150-PD1 and second chip pads 150-PD2. Consequently, the data line DL may be electrically connected to the pad portion PD through the data driving circuit 150 provided as a control circuit chip.

Though it is shown in FIG. 3B that the first chip pads 150-PD1 and the second chip pads 150-PD2 may be spaced apart from each other with a predetermined interval and successively arranged or disposed in the first direction (for example the x-direction), the first chip pads 150-PD1 and the second chip pads 150-PD2 may be arranged or disposed along rows in the first direction (for example the x-direction) and along columns in the second direction (for example the y-direction) as shown in FIG. 6 below.

Figure 4A:
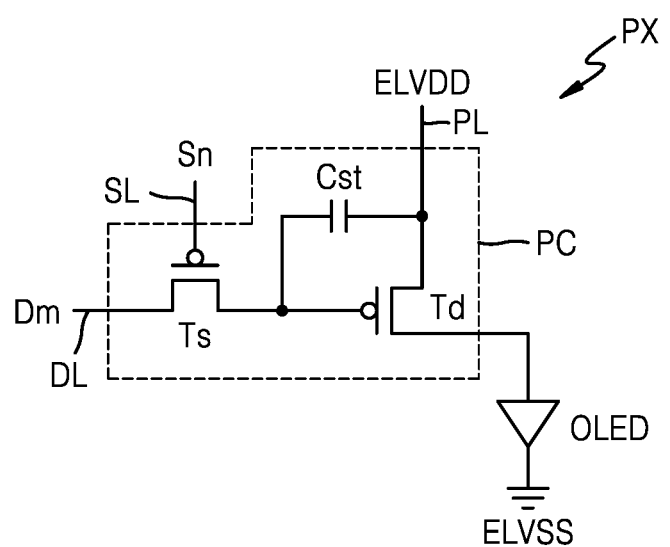
FIGS. 4A and 4B are equivalent circuit diagrams of a pixel that may be included in a display apparatus according to an embodiment.
Figure 4B:
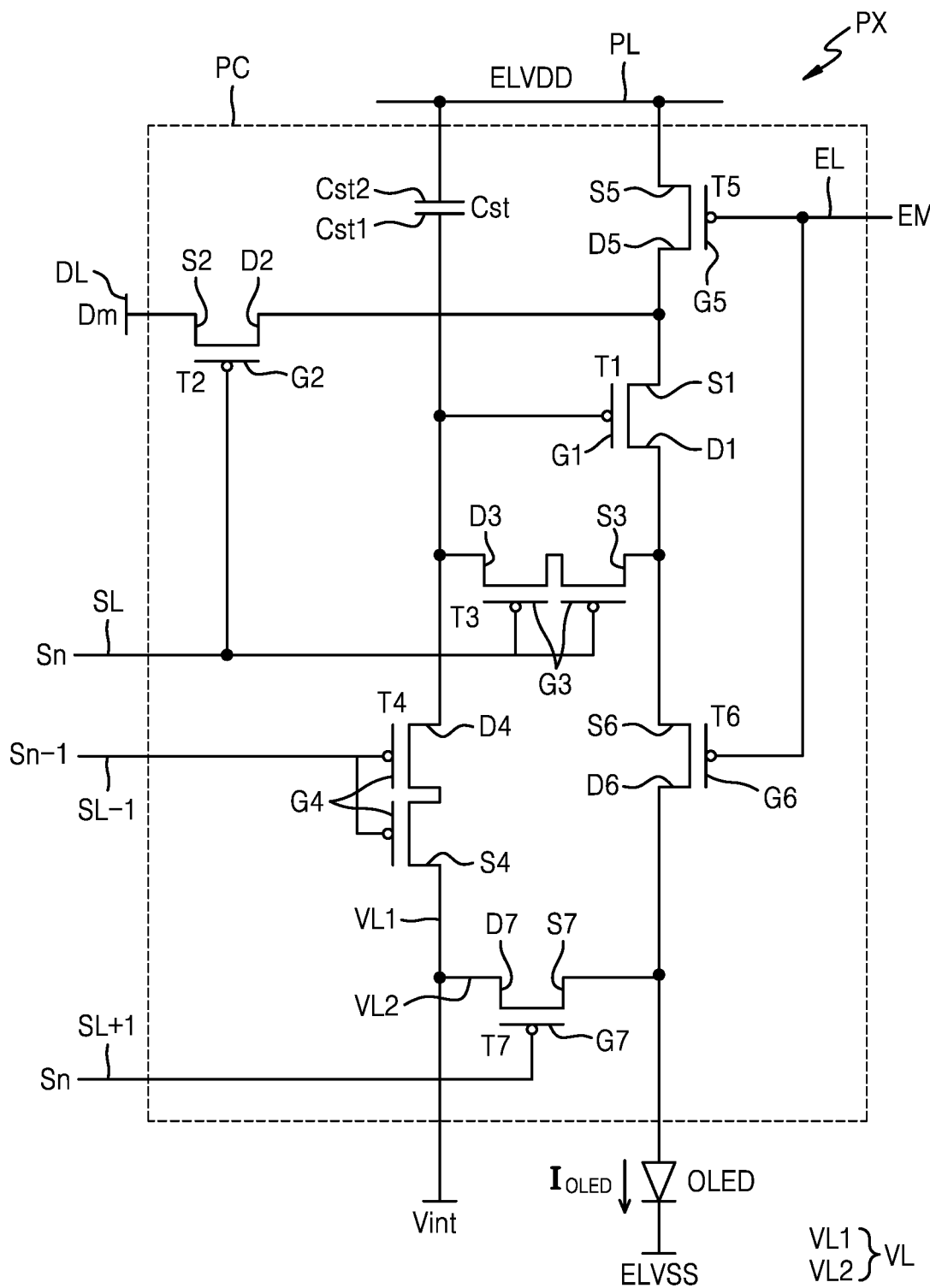

FIGS. 4A and 4B are equivalent circuit diagrams of a pixel that may be included in the display apparatus 1 according to an embodiment.

Referring to FIG. 4A, each pixel PX may include the driving voltage line PL, a pixel circuit PC, and an organic light-emitting diode OLED, the pixel circuit PC being electrically connected to the scan line SL and the data line DL, and the organic light-emitting diode OLED being electrically connected to the pixel circuit PC.

The pixel circuit PC may include a driving thin film transistor Td, a switching thin film transistor Ts, and a storage capacitor Cst. The switching thin film transistor Ts may be electrically connected to the scan line SL and the data line DL and transfer a data signal Dm to the driving thin film transistor Td in response to a scan signal Sn input through the scan line SL, the data signal Dm being input through the data line DL.

The storage capacitor Cst may be electrically connected to the switching thin film transistor Ts and the driving voltage line PL and store a voltage corresponding to a difference between a voltage transferred from the switching thin film transistor Ts and a driving voltage, for example, the first power voltage ELVDD, supplied to the driving voltage line PL.

The driving thin film transistor Td may be electrically connected to the driving voltage line PL and the storage capacitor Cst and may control a driving current flowing through the organic light-emitting diode OLED from the driving voltage line PL in response to the voltage stored in the storage capacitor Cst. The organic light-emitting diode OLED may emit light having a predetermined brightness according to the driving current.

Though FIG. 4A describes the case where the pixel circuit PC may include two thin film transistors and one storage capacitor, the embodiment is not limited thereto. In an embodiment, the pixel circuit PC may include seven thin film transistors and one storage capacitor as shown in FIG. 4B. In an embodiment, the pixel circuit PC may include two or more storage capacitors.

Referring to FIG. 4B, the pixel PX may include the pixel circuit PC and the organic light-emitting diode OLED electrically connected to the pixel circuit PC. The pixel circuit PC may include thin film transistors T1, T2, T3, T4, T5, T6, and T7 and the storage capacitor Cst. The thin film transistors T1, T2, T3, T4, T5, T6, and T7 and the storage capacitor Cst may be electrically connected to signal lines SL, SL−1, SL+1, EL, and DL, an initialization voltage line VL, and the driving voltage line PL.

Though it is shown in FIG. 4B that each pixel PX may be electrically connected to the signal lines SL, SL−1, SL+1, EL, and DL, the initialization voltage line VL, and the driving voltage line PL, an embodiment is not limited thereto. In an embodiment, at least one of the signal lines SL, SL−1, SL+1, EL, and DL, a first initialization voltage line VL1, a second initialization voltage line VL2, and the driving voltage line PL may be shared by neighboring or adjacent pixels.

The thin film transistors T1, T2, T3, T4, T5, T6, and T7 may include the driving thin film transistor T1, the switching thin film transistor T2, a compensation thin film transistor T3, a first initialization thin film transistor T4, an operation control thin film transistor T5, an emission control thin film transistor T6, and a second initialization thin film transistor T7.

The signal lines SL, SL−1, SL+1, EL, and DL may include the scan line SL, the previous scan line SL−1, the next scan line SL+1, the emission control line EL, and the data line DL, the scan line SL transferring a scan signal Sn, the previous scan line SL−1 transferring a previous scan signal Sn-1 to the first initialization thin film transistor T4, the next scan line SL+1 transferring a scan signal Sn to the second initialization thin film transistor T7, the emission control line EL transferring an emission control signal EM to the operation control thin film transistor T5 and the emission control thin film transistor T6, and the data line DL intersecting with the scan line SL and transferring a data signal Dm.

The driving voltage line PL may transfer the driving voltage ELVDD to the driving thin film transistor T1, the first initialization voltage line VL1 may transfer an initialization voltage Vint to the first initialization thin film transistor T4, and the second initialization voltage line VL2 may transfer the initialization voltage Vint to the second initialization thin film transistor T7.

A driving gate electrode G1 of the driving thin film transistor T1 may be electrically connected to a first storage capacitor plate Cst1 of the storage capacitor Cst, a driving source electrode S1 of the driving thin film transistor T1 may be electrically connected to the driving voltage line PL through the operation control thin film transistor T5, and a driving drain electrode D1 of the driving thin film transistor T1 may be electrically connected to a pixel electrode of the organic light-emitting diode OLED through the emission control thin film transistor T6. The driving thin film transistor T1 may receive a data signal Dm depending on a switching operation of the switching thin film transistor T2 and supply a driving current $I_{OLED}$ to the organic light-emitting diode OLED.

A switching gate electrode G2 of the switching thin film transistor T2 may be electrically connected to the scan line SL, a switching source electrode S2 of the switching thin film transistor T2 may be electrically connected to the data line DL, and a switching drain electrode D2 of the switching thin film transistor T2 may be electrically connected to the driving source electrode S1 of the driving thin film transistor T1 and simultaneously electrically connected to the driving voltage line PL through the operation control thin film transistor T5. The switching thin film transistor T2 may be turned on in response to a scan signal Sn transferred through the scan line SL and perform a switching operation of transferring a data signal Dm transferred through the data line DL to the driving source electrode S1 of the driving thin film transistor T1.

A compensation gate electrode G3 of the compensation thin film transistor T3 may be electrically connected to the scan line SL, a compensation source electrode S3 of the compensation thin film transistor T3 may be electrically connected to the driving drain electrode D1 of the driving thin film transistor T1 and simultaneously electrically connected to the pixel electrode of the organic light-emitting diode OLED through the emission control thin film transistor T6, and a compensation drain electrode D3 of the compensation thin film transistor T3 may be electrically connected to the first storage capacitor plate Cst1 of the storage capacitor Cst, a first initialization drain electrode D4 of the first initialization thin film transistor T4, and the driving gate electrode G1 of the driving thin film transistor T1. The compensation thin film transistor T3 may be turned on in response to a scan signal Sn transferred through the scan line SL to diode-connect the driving thin film transistor T1 by electrically connecting the driving gate electrode G1 to the driving drain electrode D1 of the driving thin film transistor T1.

A first initialization gate electrode G4 of the first initialization thin film transistor T4 may be electrically connected to the previous scan line SL−1, a first initialization source electrode S4 of the first initialization thin film transistor T4 may be electrically connected to the first initialization voltage line VL1, and a first initialization drain electrode D4 of the first initialization thin film transistor T4 may be electrically connected to the first storage capacitor plate Cst1 of the storage capacitor Cst, the compensation drain electrode D3 of the compensation thin film transistor T3, and the driving gate electrode G1 of the driving thin film transistor T1. The first initialization thin film transistor T4 may be turned on in response to a previous scan signal Sn−1 transferred through the previous scan line SL−1 and may perform an initialization operation of initializing a voltage of the gate electrode G1 of the driving thin film transistor T1 by transferring the initialization voltage Vint to the driving gate electrode G1 of the driving thin film transistor T1.

An operation control gate electrode G5 of the operation control thin film transistor T5 may be electrically connected to the emission control line EL, an operation control source electrode S5 of the operation control thin film transistor T5 may be electrically connected to the driving voltage line PL, and an operation control drain electrode D5 of the operation control thin film transistor T5 may be electrically connected to the driving source electrode S1 of the driving thin film transistor T1, and the switching drain electrode D2 of the switching thin film transistor T2.

An emission control gate electrode G6 of the emission control thin film transistor T6 may be electrically connected to the emission control line EL, an emission control source electrode S6 of the emission control thin film transistor T6 may be electrically connected to the driving drain electrode D1 of the driving thin film transistor T1 and the compensation source electrode S3 of the compensation thin film transistor T3, and an emission control drain electrode D6 of the emission control thin film transistor T6 may be electrically connected to the second initialization source electrode S7 of the second initialization thin film transistor T7 and the pixel electrode of the organic light-emitting diode OLED.

The operation control thin film transistor T5 and the emission control thin film transistor T6 may be simultaneously turned on in response to an emission control signal EM transferred through the emission control line EL, the driving voltage ELVDD may be transferred to the organic light-emitting diode OLED, and the driving current $I_{OLED}$ may flow through the main organic light-emitting diode OLED.

A second initialization gate electrode G7 of the second initialization thin film transistor T7 may be electrically connected to the next scan line SL+1, a second initialization source electrode S7 of the second initialization thin film transistor T7 may be electrically connected to the emission control drain electrode D6 of the emission control thin film transistor T6 and the pixel electrode of the organic light-emitting diode OLED, and a second initialization drain electrode D7 of the second initialization thin film transistor T7 may be electrically connected to the second initialization voltage line VL2.

Because the scan line SL may be electrically connected to the next scan line SL+1, the same scan signal Sn may be applied to the scan line SL and the next scan line SL+1. Therefore, the second initialization thin film transistor T7 may be turned on in response to a scan signal Sn transferred through the next scan line SL+1 and may perform an operation of initializing the pixel electrode of the organic light-emitting diode OLED.

A second storage capacitor plate Cst2 of the storage capacitor Cst may be electrically connected to the driving voltage line PL, and an opposite electrode of the organic light-emitting diode OLED may be electrically connected to a common voltage ELVSS. Therefore, the organic light-emitting diode OLED may display an image by receiving the driving current $I_{OLED}$ from the driving thin film transistor T1 and emit light.

Though it is shown in FIG. 4B that the compensation thin film transistor T3 and the initialization thin film transistor T4 may have a dual gate electrode, the compensation thin film transistor T3 and the initialization thin film transistor T4 may have one gate electrode.

Figure 5A:
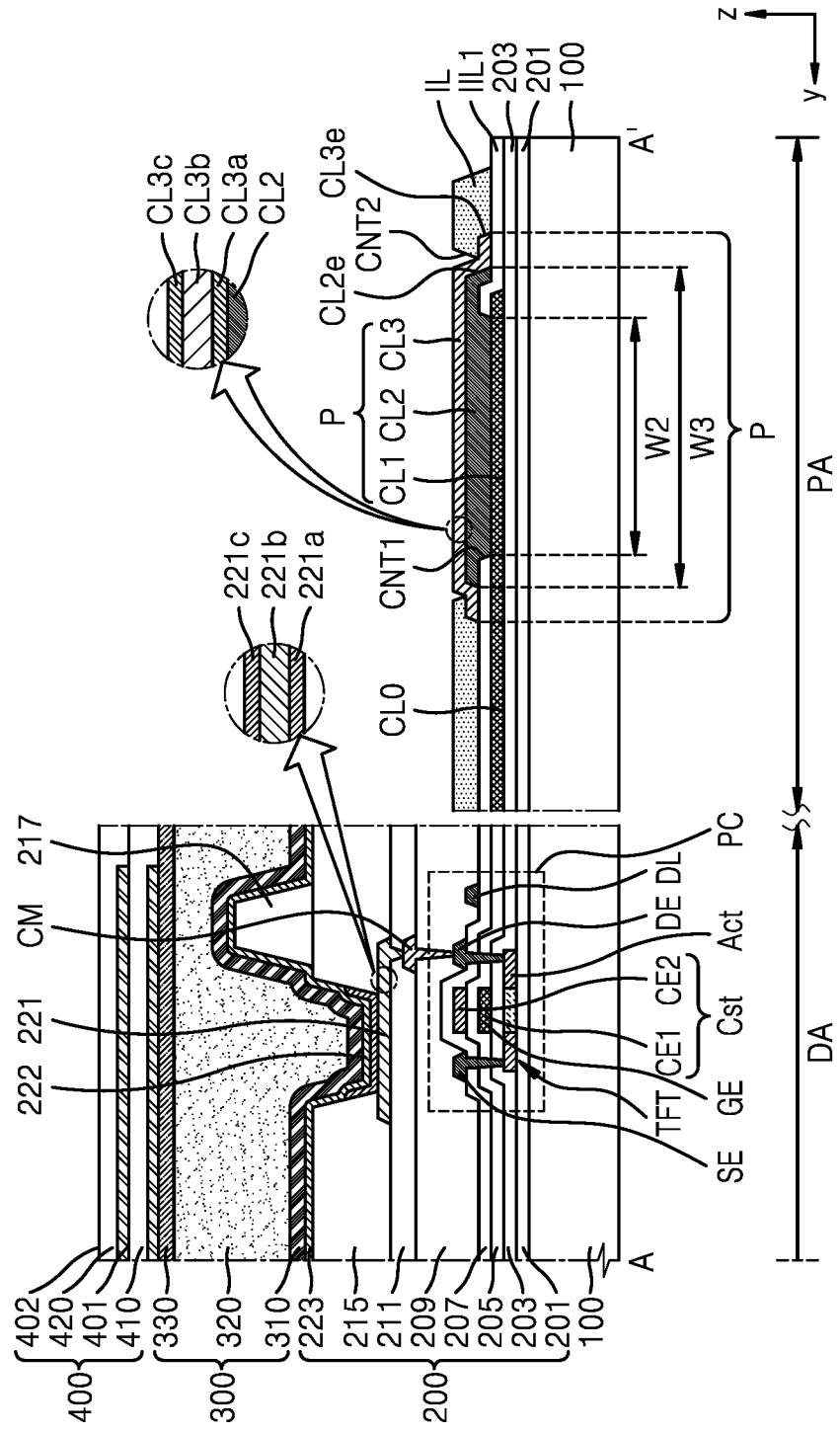
FIGS. 5A and 5B are schematic cross-sectional views of a portion or region of a display panel according to an embodiment.
Figure 5B:
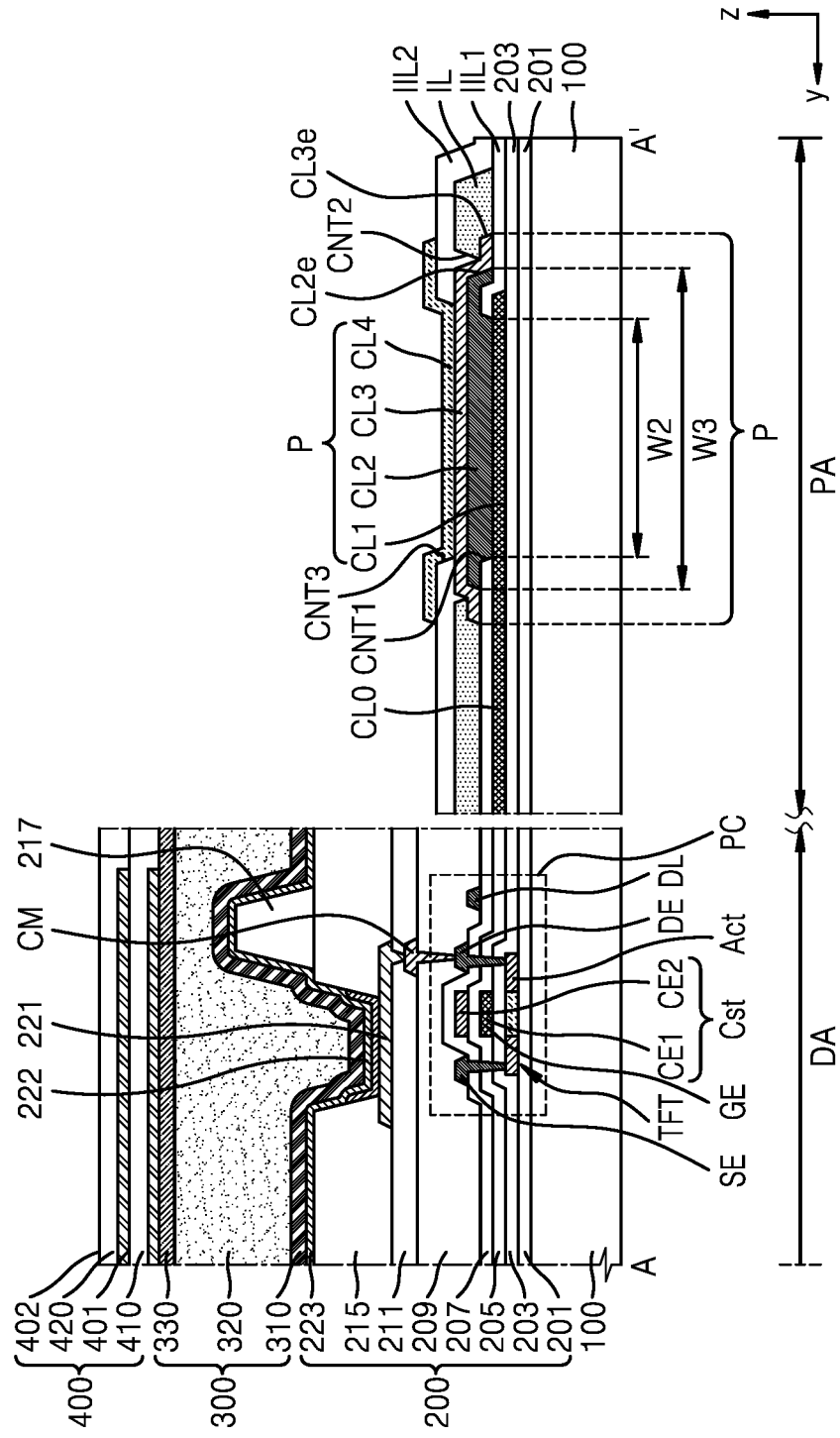

FIGS. 5A and 5B are schematic cross-sectional views of a portion or region of a display panel according to an embodiment. FIGS. 5A and 5B may correspond to a cross-section of the display panel taken along line A-A' of FIG. 3A.

A cross-sectional structure of the display area DA is described with reference to the display area DA of the display apparatus 1 of FIG. 5A.

The substrate 100 may include glass or a polymer resin. In a case where the substrate 100 may include a polymer resin, the substrate 100 may include polyethersulfone, polyacrylate, polyetherimide, polyethylene naphthalate, polyethylene terephthalate, polyphenylene sulfide, polyarylate, polyimide, polycarbonate, or cellulose acetate propionate.

In an embodiment, the substrate 100 may include at least one organic layer and at least one inorganic layer. The at least one organic layer may include the above polymer resin. The at least one inorganic layer may include an inorganic material such as silicon nitride ($SiN_x$), silicon oxide ($SiO_x$), or silicon oxynitride ($SiO_xN_y$).

A buffer layer 201 may be formed or disposed on the substrate 100, the buffer layer 201 preventing impurities from penetrating into a semiconductor layer Act of a thin film transistor TFT. The buffer layer 201 may include an inorganic insulating material such as silicon nitride, silicon oxide, and silicon oxynitride and include a single layer or a multi-layer including the inorganic insulating material.

The pixel circuit PC may be arranged or disposed on the buffer layer 201. The pixel circuit PC may include a thin film transistor TFT and a storage capacitor Cst. The thin film transistor TFT may include the semiconductor layer Act, a gate electrode GE, a source electrode SE, and a drain electrode DE, the source electrode SE and the drain electrode DE being connection electrodes. The thin film transistor TFT shown in FIG. 5A may be a driving thin film transistor and may correspond to the driving thin film transistor T1 described with reference to FIG. 4B. Though not shown in FIG. 5A, a data line DL of the pixel circuit PC may be electrically connected to a switching thin film transistor of the pixel circuit PC.

The semiconductor layer Act may include polycrystalline silicon. Alternatively, the semiconductor layer Act may include amorphous silicon, an oxide semiconductor, or an organic semiconductor.

The gate electrode GE may include a low-resistance metal material. The gate electrode GE may include a conductive material including molybdenum (Mo), aluminum (Al), copper (Cu), and titanium (Ti) and include a single layer or a multi-layer including the above materials. Though an embodiment shows a top-gate type thin film transistor TFT in which the gate electrode GE may be arranged or disposed over the semiconductor layer Act with a gate insulating layer 203 therebetween, the thin film transistor TFT may include a bottom-gate type thin film transistor in an embodiment.

The gate insulating layer 203 between the semiconductor layer Act and the gate electrode GE may include an inorganic insulating material such as silicon oxide, silicon oxynitride, silicon nitride, aluminum oxide, titanium oxide, tantalum oxide, and hafnium oxide. The gate insulating layer 203 may include a single layer or a multi-layer including the above materials.

The source electrode SE and the drain electrode DE, which may be the connection electrodes electrically connected to the semiconductor layer Act, may be arranged or disposed on the same layer as the data line DL and may include the same or similar material as the data line DL. The source electrode SE, the drain electrode DE, and the data line DL may include a material having excellent conductivity. The source electrode SE and the drain electrode DE may include a conductive material including molybdenum (Mo), aluminum (Al), copper (Cu), and titanium (Ti) and may include a single layer or a multi-layer including the above materials. In an embodiment, the source electrode SE and the drain electrode DE may include a multi-layer of Ti/Al/Ti.

The storage capacitor Cst may include a bottom electrode CE1 and a top electrode CE2 overlapping each other with a first interlayer insulating layer 205 disposed therebetween. The storage capacitor Cst may overlap the thin film transistor TFT. With regard to this, it is shown in FIG. 5A that the gate electrode GE of the thin film transistor TFT serves as the bottom electrode CE1 of the storage capacitor Cst. In an embodiment, the storage capacitor Cst may not overlap the thin film transistor TFT. The storage capacitor Cst may be covered or overlapped by a second interlayer insulating layer 207. The top electrode CE2 of the storage capacitor Cst may include a conductive material including molybdenum (Mo), aluminum (Al), copper (Cu), and titanium (Ti) and may include a single layer or a multi-layer including the above materials.

The first interlayer insulating layer 205 and the second interlayer insulating layer 207 may include an inorganic insulating material such as silicon oxide, silicon oxynitride, silicon nitride, aluminum oxide, titanium oxide, tantalum oxide, and hafnium oxide. The first interlayer insulating layer 205 and the second interlayer insulating layer 207 may include a single layer or a multi-layer including the above materials.

A first organic insulating layer 209 and a second organic insulating layer 211 may be arranged or disposed on the second interlayer insulating layer 207. The first organic insulating layer 209 and the second organic insulating layer 211 may include an approximately flat top surface.

The pixel circuit PC may be electrically connected to a pixel electrode 221. For example, as shown in FIG. 5A, a connection electrode CM may be arranged or disposed between the thin film transistor TFT and the pixel electrode 221. The connection electrode CM may be electrically connected to the thin film transistor TFT through a contact hole formed in the first organic insulating layer 209, and the pixel electrode 221 may be electrically connected to the connection electrode CM through a contact hole or via hole formed in the second organic insulating layer 211. The connection electrode CM may include a conductive material including molybdenum (Mo), aluminum (Al), copper (Cu), and titanium (Ti) and may include a single layer or a multi-layer including the above materials. In an embodiment, the connection electrode CM may include a multi-layer of Ti/Al/Ti.

The first organic insulating layer 209 and the second organic insulating layer 211 may include an organic insulating material such as a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an embodiment, the first organic insulating layer 209 and the second organic insulating layer 211 may include polyimide.

The pixel electrode 221 may be formed or disposed on the second organic insulating layer 211. The pixel electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In an embodiment, the pixel electrode 221 may include a layer including ITO, IZO, ZnO, or $In_2O_3$ on/under or below the reflective layer. In an embodiment, the pixel electrode 221 may include a first layer 221a, a second layer 221b, and a third layer 221c and may have a triple-layered structure of ITO/Ag/ITO.

A pixel-defining layer 215 may be formed or disposed on the pixel electrode 221. The pixel-defining layer 215 may include an opening exposing a top surface of the pixel electrode 221 and may cover or overlap the edges of the pixel electrode 221. The pixel-defining layer 215 may include an organic insulating material. Alternatively, the pixel-defining layer 215 may include an inorganic insulating material such as silicon nitride ($SiN_x$), silicon oxide ($SiO_x$), or silicon oxynitride ($SiO_xN_y$). Alternatively, the pixel-defining layer 215 may include an organic insulating material and an inorganic insulating material.

An intermediate layer 222 may include an emission layer. The emission layer may include a polymer organic material or a low molecular weight organic material emitting light having a certain or predetermined color. Though not shown, the intermediate layer 222 may include at least one organic material layer under or below and/or on the emission layer.

In an embodiment, a first functional layer arranged or disposed between the pixel electrode 221 and the emission layer may include a single layer or a multi-layer. For example, in a case where the first functional layer may include a polymer material, though not shown, the first functional layer may include a hole transport layer (HTL), which may have a single-layered structure, and may include poly(3,4-ethylenedioxythiophene) (PEDOT) or polyaniline (PANT). In a case where the first functional layer may include a low molecular weight material, though not shown, the first functional layer may include a hole injection layer (HIL) and a hole transport layer (HTL).

A second functional layer arranged or disposed between the emission layer and the opposite electrode may be omitted. For example, in a case where the first functional layer and the emission layer include a polymer material, the second functional layer may be formed. The second functional layer may include a single layer or a multi-layer.

Though not shown, the second functional layer may include an electron transport layer (ETL) and/or an electron injection layer (EIL).

The emission layer of the intermediate layer 222 may be arranged or disposed for each pixel in the display area DA. In FIG. 5A, the intermediate layer 222 is shown as a portion corresponding to the emission layer. The emission layer may be patterned to correspond to the pixel electrode 221. Unlike the emission layer, the first functional layer and/or the second functional layer of the intermediate layer 222 may be provided to not only the display area DA but also may be provided to a portion of the peripheral area PA.

An opposite electrode 223 may include a conductive material having a low work function. For example, the opposite electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 223 may include a layer including IZO, ZnO, or $In_2O_3$ on the (semi) transparent layer including the above material. The opposite electrode 223 may be formed or disposed in not only the display area DA but may also be disposed in a portion of the peripheral area PA. The opposite electrode 223 may be formed by using thermal deposition, by way of non-limiting example.

A spacer 217 may be formed or disposed on the pixel-defining layer 215. The spacer 217 may include an organic insulating material such as polyimide. Alternatively, the spacer 217 may include an inorganic insulating material or may include an organic insulating material and an inorganic material.

The spacer 217 may include a material which may be the same as or different from that of the pixel-defining layer 215. For example, the pixel-defining layer 215 and the spacer 217 may be simultaneously formed during a mask process that may use a halftone mask. In an embodiment, the pixel-defining layer 215 and the spacer 217 may include polyimide.

The organic light-emitting diode OLED may be covered or overlapped by a thin-film encapsulation layer 300. The thin-film encapsulation layer 300 may include at least one organic encapsulation layer and at least one inorganic encapsulation layer. It is shown in FIG. 5A that the thin-film encapsulation layer 300 may include first and second inorganic encapsulation layers 310 and 330 and an organic encapsulation layer 320 therebetween. In an embodiment, the number of organic encapsulation layers, the number of inorganic encapsulation layers, and a stacking sequence may vary within the spirit and the scope of the disclosure.

The first inorganic encapsulation layer 310 and the second inorganic encapsulation layer 330 may include at least one inorganic material among aluminum oxide, titanium oxide, tantalum oxide, hafnium oxide, zinc oxide, silicon oxide, silicon oxynitride, and silicon nitride. The first inorganic encapsulation layer 310 and the second inorganic encapsulation layer 330 may include a single layer or a multi-layer including the above material.

The organic encapsulation layer 320 may include a polymer-based material. The polymer-based material may include an acryl-based resin, an epoxy-based resin, polyimide, and polyethylene. In an embodiment, the organic encapsulation layer 320 may include acrylate.

A touch sensing layer 400 may be arranged or disposed on the thin-film encapsulation layer 300. It is shown in FIG. 5A that the touch sensing layer 400 may be directly arranged or disposed on the thin-film encapsulation layer 300. The touch sensing layer 400 may include a first touch electrode layer 410, a second touch electrode layer 420, a first inorganic layer 401, and a second inorganic layer 402, the second touch electrode layer 420 being disposed on the first touch electrode layer 410, the first inorganic layer 401 being disposed between the first touch electrode layer 410 and the second touch electrode layer 420, and the second inorganic layer 402 being disposed on the second touch electrode layer 420. The first touch electrode layer 410 may be electrically connected to the second touch electrode layer 420 through a contact hole passing through the first inorganic layer 401.

A pad P may be arranged or disposed in the peripheral area PA. A buffer layer 201 and a gate insulating layer 203 may be arranged or disposed between the pad P and the substrate 100, the buffer layer 201 and the gate insulating layer 203 extending from the display area DA.

The pad P may include a first conductive layer CL1, a second conductive layer CL2, and a third conductive layer CL3. The first conductive layer CL1, the second conductive layer CL2, and the third conductive layer CL3 may be sequentially stacked and electrically connected to each other. The first conductive layer CL1 may be electrically connected to the display portion 200 through a connection line CL0 arranged or disposed on the same layer as the first conductive layer CL1. Though it is shown in an embodiment that the connection line CL0 may be arranged or disposed on the same layer as the first conductive layer CL1, the connection line CL0 may be arranged or disposed on a layer different from the first conductive layer CL1. In an embodiment, the first conductive layer CL1 may include the same or similar material as the gate electrode GE of the thin film transistor TFT. In an embodiment, the first conductive layer CL1 may include the same or similar material as the top electrode CE2 of the storage capacitor Cst.

The second conductive layer CL2 may be arranged or disposed on the first conductive layer CL1. A first inorganic insulating layer IIL1 may be arranged or disposed between the first conductive layer CL1 and the second conductive layer CL2. The first conductive layer CL1 may be electrically connected to the second conductive layer CL2 through a first contact hole CNT1 passing through the first inorganic insulating layer IIL1. In an embodiment, the second conductive layer CL2 may include the same or similar material as the source electrode SE or the drain electrode DE of the thin film transistor TFT. In an embodiment, the first inorganic insulating layer IIL1 may include the same or similar material as the first interlayer insulating layer 205 or the second interlayer insulating layer 207 in the display area DA.

The third conductive layer CL3 may be arranged or disposed on the second conductive layer CL2. The third conductive layer CL3 may completely cover or overlap the second conductive layer CL2. In other words, a width W3 of the third conductive layer CL3 may be greater than a width W2 of the second conductive layer CL2 to cover or overlap an end CL2e of the second conductive layer CL2. In an embodiment, the third conductive layer CL3 may include the same or similar material as the connection electrode CM and may include a first layer CL3a, a second layer CL3b, and a third layer CL3c having, for example, a triple-layered structure of Ti/Al/Ti.

The insulating layer IL may be arranged or disposed on the third conductive layer CL3 and may include a second contact hole CNT2 exposing the central portion of the third conductive layer CL3. At least a portion of the third conductive layer CL3 may be exposed to the outside through the second contact hole CNT2 and may be electrically connected to the pad portion PCB-P of the printed circuit board PCB shown in FIG. 3A or 3B. The insulating layer IL may clad an end CL3e of the third conductive layer CL3. Through this, the insulating layer IL may cover or overlap the third conductive layer CL3 such that a second layer CL3b of the third conductive layer CL3 may not be exposed to the outside, the third conductive layer CL3 including a first layer CL3a, the second layer CL3b, and a third layer CL3c having a triple-layered structure of Ti/Al/Ti, and the second layer CL3b including aluminum (Al).

In an embodiment, the insulating layer IL may include the same or similar material as the second organic insulating layer 211 in the display area DA. In an embodiment, the thickness of the insulating layer IL may be in a range of about 6000 Å to about 8000 Å. In a case where the thickness of the insulating layer IL may be less than about 6000 Å, the cladding of an end CL3e of the third conductive layer CL3 may be difficult to efficiently perform. In a case where the thickness of the insulating layer IL may be greater than about 8000 Å, the third conductive layer CL3 may become vulnerable to exfoliation.

As a comparative example, in a case where the end of the third conductive layer is exposed without the insulating layer, silver ions $Ag^+$ generated while the pixel electrode is formed combine with aluminum (Al) of the third conductive layer and are precipitated as silver (Ag) particles at the end of the third conductive layer to deteriorate the reliability of the third conductive layer. In the display apparatus 1 according to an embodiment, the insulating layer IL may prevent silver (Ag) particles from being precipitated by a reduction reaction at the end CL3e of the third conductive layer CL3 while the pixel electrode 221 is formed, by cladding the end CL3e of the third conductive layer CL3.

The pad portion PD of FIG. 5B may be different from the pad portion PD of FIG. 5A in the stacked structure. The pad portion PD of FIG. 5B may include a second inorganic insulating layer IIL2 and a fourth conductive layer CL4, compared to FIG. 5A. Because other configurations may be the same as those of an embodiment of FIG. 5A, differences are mainly described below.

Referring to FIG. 5B, the pad P may include a first conductive layer CL1, a second conductive layer CL2, a third conductive layer CL3, and a fourth conductive layer CL4. The first to fourth conductive layers CL1, CL2, CL3, and CL4 may be electrically connected to each other.

In FIG. 5B, the second inorganic insulating layer IIL2 may be arranged or disposed on the insulating layer IL. The second inorganic insulating layer IIL2 may cover or overlap a top surface of the insulating layer IL and may include a third contact hole CNT3 exposing a portion of the third conductive layer CL3 exposed through the second contact hole CNT2. In an embodiment, the second inorganic insulating layer IIL2 may include the same or similar material as the first inorganic layer 401 of the touch sensing layer 400. However, the embodiment is not limited thereto, and the second inorganic insulating layer IIL2 may include any inorganic layer as long as the inorganic layer is formed on the insulating layer IL.

The fourth conductive layer CL4 may be arranged or disposed on the second inorganic insulating layer IIL2 and may contact the third conductive layer CL3 through the third contact hole CNT3. The fourth conductive layer CL4 may become a finally exposed portion of the pad P. The pad portion PCB-P of the printed circuit board PCB may be attached to the fourth conductive layer CL4. In an embodiment, the fourth conductive layer CL4 may include the same or similar material as the second touch electrode layer 420 of the touch sensing layer 400. However, an embodiment is not limited thereto, and the fourth conductive layer CL4 may include the same or similar material as the first touch electrode layer 410.

Figure 7A:
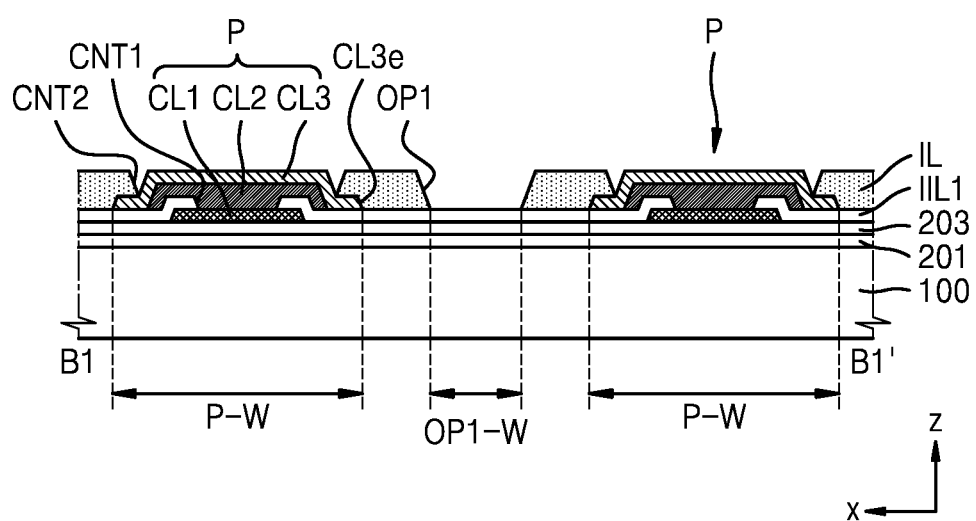
FIG. 7A is a schematic cross-sectional view of a pad portion taken along line B1-B1' of FIG. 6.
Figure 7B:
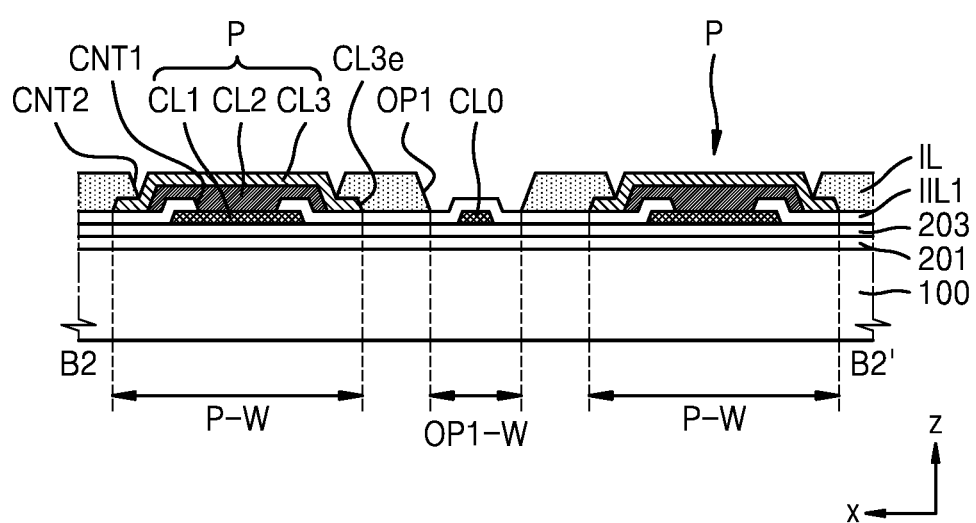
FIG. 7B is a schematic cross-sectional view of a pad portion taken along line B2-B2' of FIG. 6.

FIG. 6 is an enlarged plan view of a portion or region of a pad portion in the display apparatus 1 according to an embodiment, FIG. 7A is a schematic cross-sectional view of the pad portion PD taken along line B1-B1' of FIG. 6, and FIG. 7B is a schematic cross-sectional view of the pad portion PD taken along line B2-B2' of FIG. 6.

Referring to FIG. 6, the pad portion PD may include pads P. The pads P of FIG. 6 may include first pads P1 of a first sub-pad portion SPD1 and second pads P2 of a second sub-pad portion SPD2 of the pad portion PD shown in FIG. 3A. Alternatively, the pads P may include first chip pads 150-PD1 and second chip pads 150-PD2 shown in FIG. 3B.

The pads P may be arranged or disposed along rows arranged or disposed in the first direction (for example the x-direction) and along columns arranged or disposed in the second direction (for example the y-direction). Though FIG. 6 shows pads P arranged or disposed on two rows in the first direction (for example the x-direction), the pads P may be arranged or disposed on three or more rows. It is shown in FIG. 6 that the pads P extend in an approximately rectangular shape in the second direction (for example the y-direction). In an embodiment, the pads P may have an approximately rectangular shape and may be arranged or disposed in a direction oblique to the second direction (for example the y-direction).

Each of the pads P may be electrically connected to the connection line CL0 and thus may be electrically connected to a pixel PX or the driving circuits, for example, the first scan driving circuit 120, the second scan driving circuit 130, and the emission control driving circuit 140. As an example, assuming that a row that may be relatively close to the display area DA is a first row R1, and a row that may be relatively away or distant from the display area DA is a second row R2, the connection line CL0 electrically connected to the pads P arranged or disposed on the second row R2 may detour around the pads P arranged or disposed on the first row R1. A portion of the connection line CL0 electrically connected to the pads P arranged or disposed on the second row R2 may overlap a first opening OP1 arranged or disposed between the pads P arranged or disposed on the first row R1. However, in this case, the connection line CL0 may not be exposed through the first opening OP1. As shown in FIG. 7B, the connection line CL0 may be covered or overlapped by an inorganic layer (for example the first interlayer insulating layer 205).

Referring to FIGS. 6 and 7A, the stacked structure of the pad P may be the same as that described with reference to FIG. 5A. The buffer layer 201 and the gate insulating layer 203 may be arranged or disposed on the substrate 100. The first conductive layer CL1, the second conductive layer CL2, and the third conductive layer CL3 may be sequentially stacked on the gate insulating layer 203. The first inorganic insulating layer IIL1 may be arranged or disposed between the first conductive layer CL1 and the second conductive layer CL2. The first conductive layer CL1 may be electrically connected to the second conductive layer CL2 through the first contact hole CNT1 passing through the first inorganic insulating layer IIL1. The third conductive layer CL3 may be arranged or disposed directly on the second conductive layer CL2. In an embodiment, an insulating layer may be arranged or disposed between the second conductive layer CL2 and the third conductive layer CL3. The second conductive layer CL2 may be electrically connected to the third conductive layer CL3 through a contact hole passing through the insulating layer.

The insulating layer IL may cover or overlap the edge of each of the pads P and may include the second contact hole CNT2 exposing the central portion of each pad P. The third conductive layer CL3 exposed through the second contact hole CNT2 may be electrically connected to the pad portion PCB-P of the printed circuit board PCB shown in FIG. 3A or 3B.

The insulating layer IL may include openings arranged or disposed between pads P neighboring each other among the pads P. Neighboring pads P may mean adjacent pads. In an embodiment, as shown in FIG. 6, first openings OP1 may be arranged or disposed between the pads P arranged or disposed in the first direction (for example the x-direction). The first openings OP1 may be provided or disposed between the pads P arranged or disposed on the first row R1 and provided or disposed between the pads P arranged or disposed on the second row R2.

The first openings OP1 are portions that may be formed by removing a portion of the insulating layer IL and may expose at least a portion of the first inorganic insulating layer IIL1 in the lower portion. Because the first openings OP1 may be arranged or disposed between the pads P neighboring or adjacent to each other among the pads P, exfoliation of the insulating layer IL due to a potential difference between the pads P neighboring each other may be prevented.

The insulating layer IL according to an embodiment may include an organic insulating material. Therefore, the insulating layer IL, which may be an organic layer, and the first inorganic insulating layer TILL which may be an inorganic layer arranged or disposed under or below the insulating layer IL, may have a characteristic of a weak adhesive force between layers. The insulating layer IL may serve as a moisture and/or current transfer path in a relevant portion. Such a characteristic may be more severe between the pads P neighboring each other in which a potential difference may occur. As a comparative example, in the case of the insulating layer in which an opening may not be formed or disposed between the pads neighboring each other, exfoliation may become severe between the insulating layer, which may be an organic layer, and the first interlayer insulating layer, which may be an inorganic layer, due to a potential difference between the neighboring pads, and a short-circuit between the pads may occur.

Because the display apparatus 1 according to an embodiment may include the first openings OP1 formed by removing portions of the insulating layer IL arranged or disposed between the pads neighboring each other, exfoliation of the insulating layer IL may be prevented in a region between the pads P neighboring each other and thus a defect rate of the pad portion PD may be minimized.

Each of the first openings OP1 may have a first width OP1-W in the first direction (for example the x-direction) and a first length OP1-L in the second direction (for example the y-direction). With regard to a "width" and a "length", a relatively short width is defined as a "width" among widths of an element (for example a pad P or an opening) measured in the first direction and the second direction, and a relatively long width is defined as a "length". This is equally applied to the specification below.

In an embodiment, the first length OP1-L of the first opening OP1 may be equal to the length P-L of the pad P in the second direction (for example the y-direction). In an embodiment, the first width OP1-W of the first opening OP1 may be less than a width P-W of the pad P in the first direction (for example the x-direction). For example, the first width OP1-W of the first opening OP1 may be in a range of about 20% to about 45% of the width P-W of the pad P. In the case where the first width OP1-W of the first opening OP1 may be less than about 20% of the width P-W of the pad P, it may be difficult to effectively prevent the exfoliation of the insulating layer IL. In contrast, in the case where the first width OP1-W of the first opening OP1 may be greater than about 45% of the width P-W of the pad P, the insulating layer IL may not stably clad the end CL3e of the third conductive layer CL3.

Figure 8:
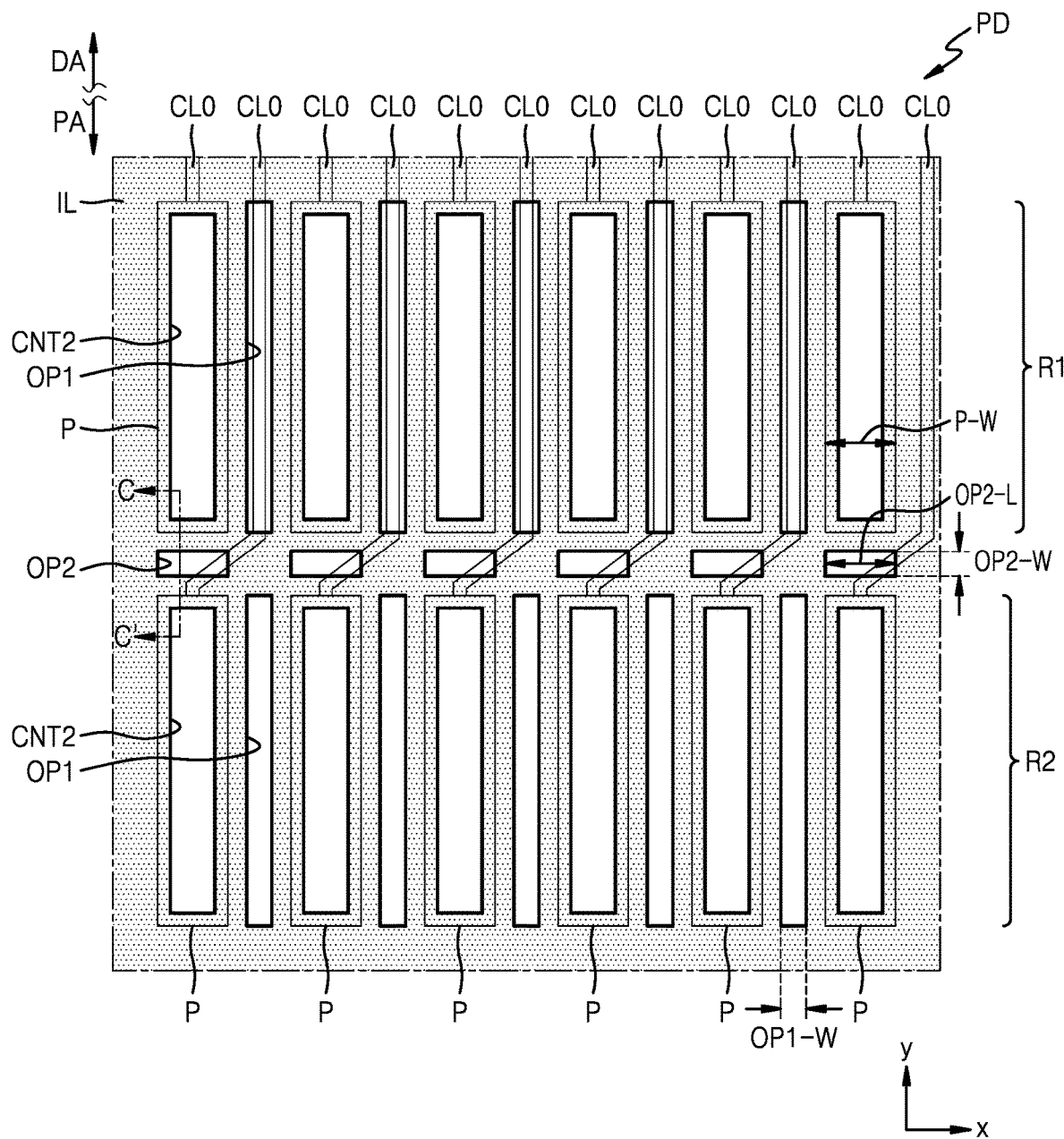
FIG. 8 is an enlarged plan view of a portion or region of a pad portion in a display apparatus according to an embodiment.
Figure 9:
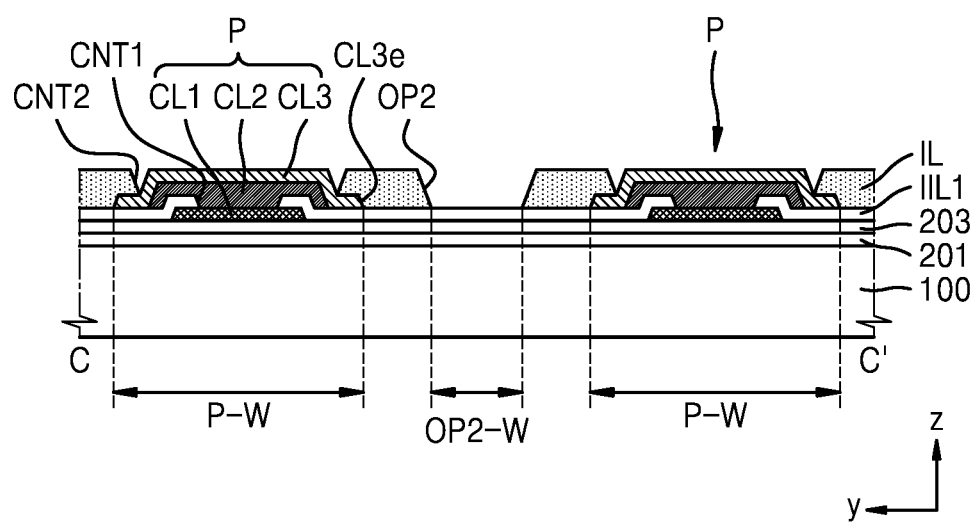
FIG. 9 is a schematic cross-sectional view of a pad portion taken along line C-C' of FIG. 6.
Figure 10:
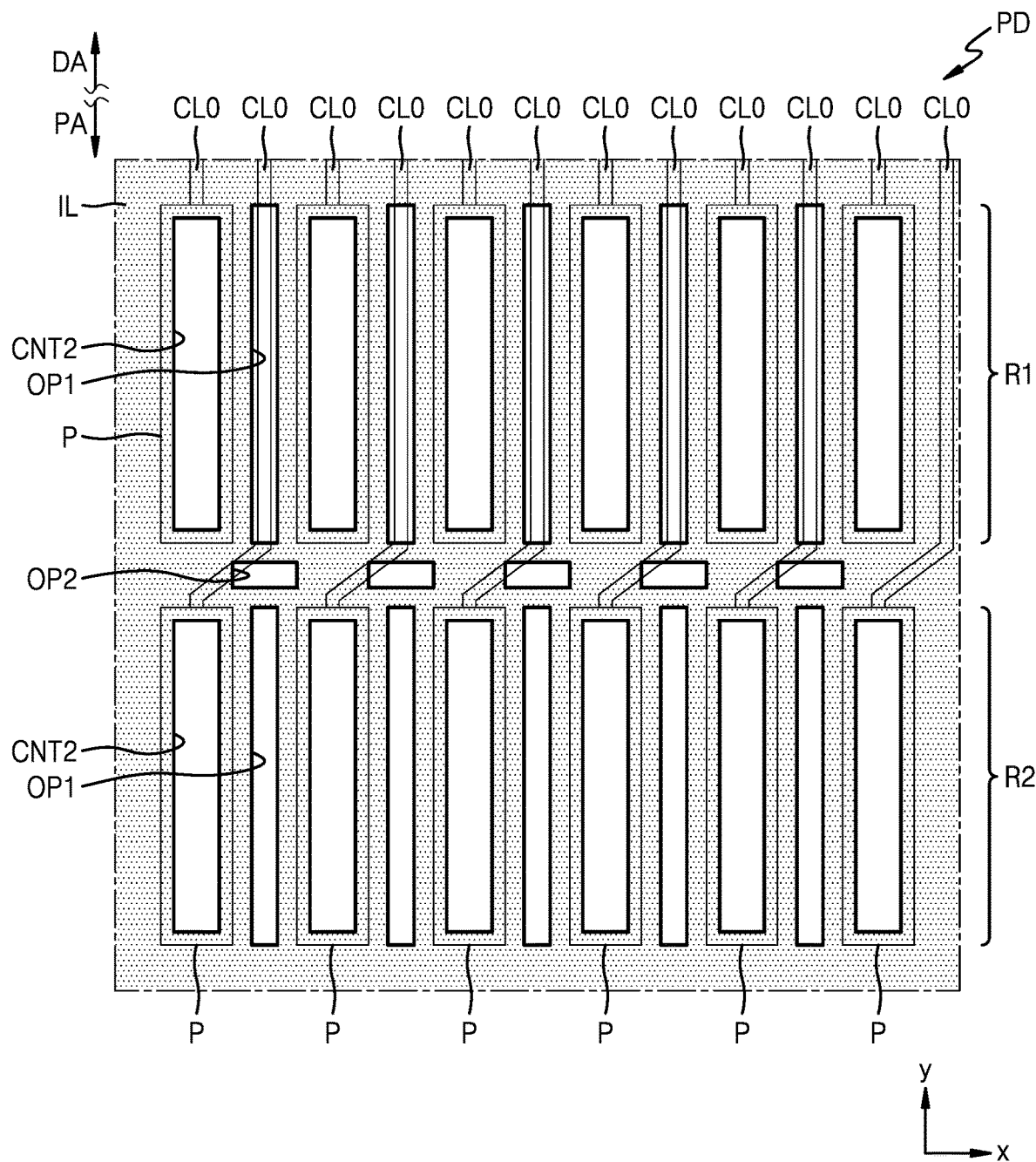
FIGS. 10 and 11 are views of modified examples of FIG. 8.
Figure 11:
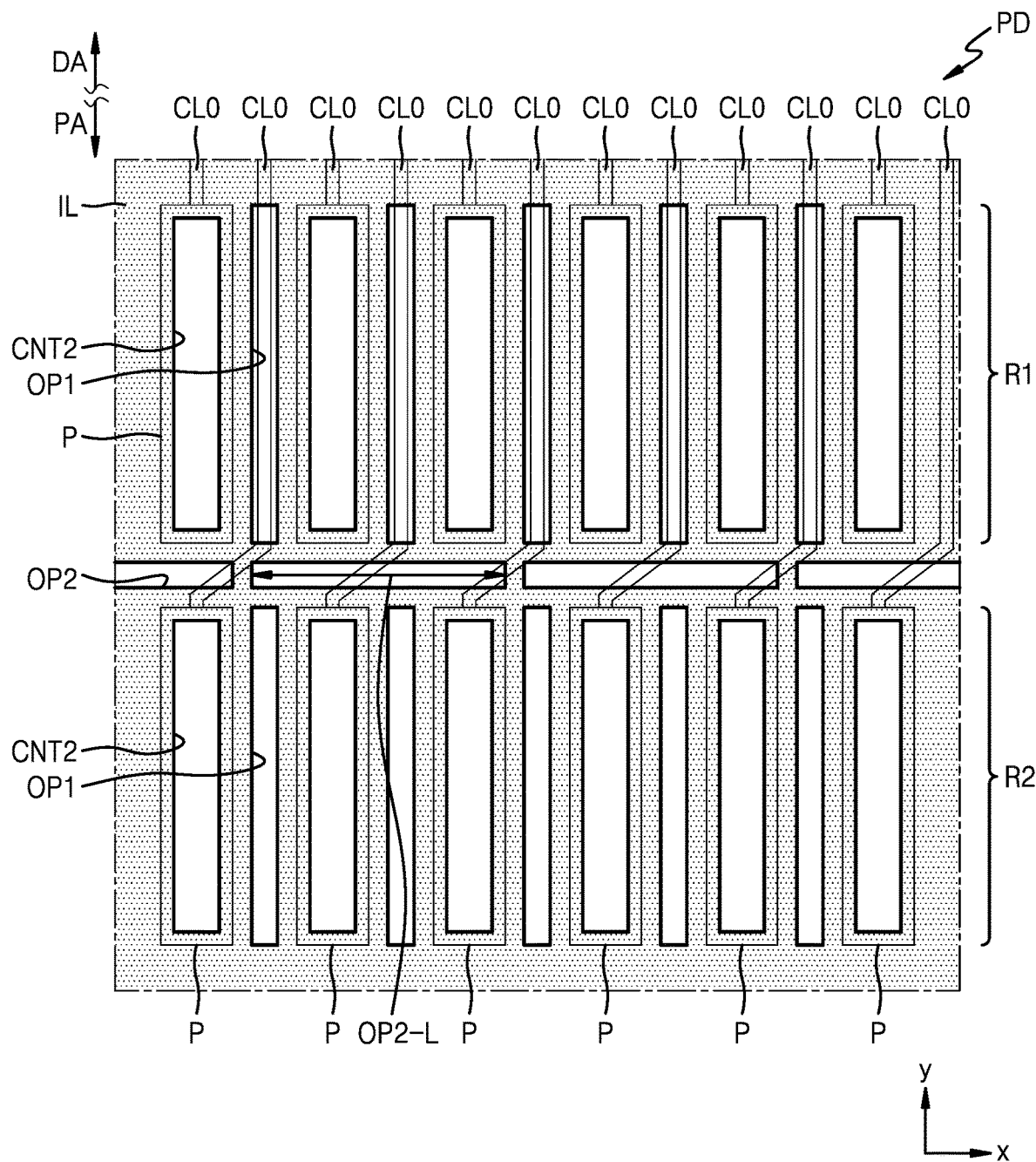

FIG. 8 is an enlarged plan view of a portion of the pad portion PD in the display apparatus 1 according to an embodiment, FIG. 9 is a schematic cross-sectional view of the pad portion PD taken along line C-C' of FIG. 8, and FIGS. 10 and 11 are views of modified examples of FIG. 8.

Referring to FIG. 8, the pad portion PD may include second openings OP2 arranged or disposed between pads P arranged or disposed in the second direction (for example the y-direction). In FIG. 8, the second openings OP2 may be arranged or disposed to correspond to a region between the pads P on the first row R1 and the pads P on the second row R2.

Referring to FIGS. 8 and 9, the second opening OP2 may be arranged or disposed in a region between the pad P on the first row R1 and the pad P on the second row R2. As with the first opening OP1 shown in FIG. 7A, the second opening OP2 is a portion that may be formed by removing at least a portion of the insulating layer IL and may expose at least a portion of the first inorganic insulating layer IIL1.

Each of the second openings OP2 may have a second length OP2-L in the first direction (for example the x-direction) and a second width OP2-W in the second direction (for example the y-direction). In an embodiment, as shown in FIG. 8, the second length OP2-L of the second opening OP2 may be generally equal to the width P-W of the pad P and less than the first length OP1-L of the first opening OP1. The second width OP2-W of the second opening OP2 may be equal to the first width OP1-W of the first opening OP1.

The position and the length of the second opening OP2 may be modified within the spirit and the scope of the disclosure. In an embodiment, as shown in FIG. 10, the second opening OP2 may be arranged or disposed to correspond to a region between the first opening OP1 on the first row R1 and the first opening OP1 on the second row R2. In an embodiment, as shown in FIG. 11, the second opening OP2 may extend in the first direction (for example the x-direction). In this case, the second length OP2-L of the second opening OP2 may correspond to at least two pads P and at least two first openings OP1 arranged or disposed in the first direction (for example the x-direction). Depending on the case, the second openings OP2 may be connected to each other in the first direction (for example the x-direction) to constitute one opening crossing or intersecting a region between the pads P on the first row R1 and the pads P on the second row R2.

Figure 15:
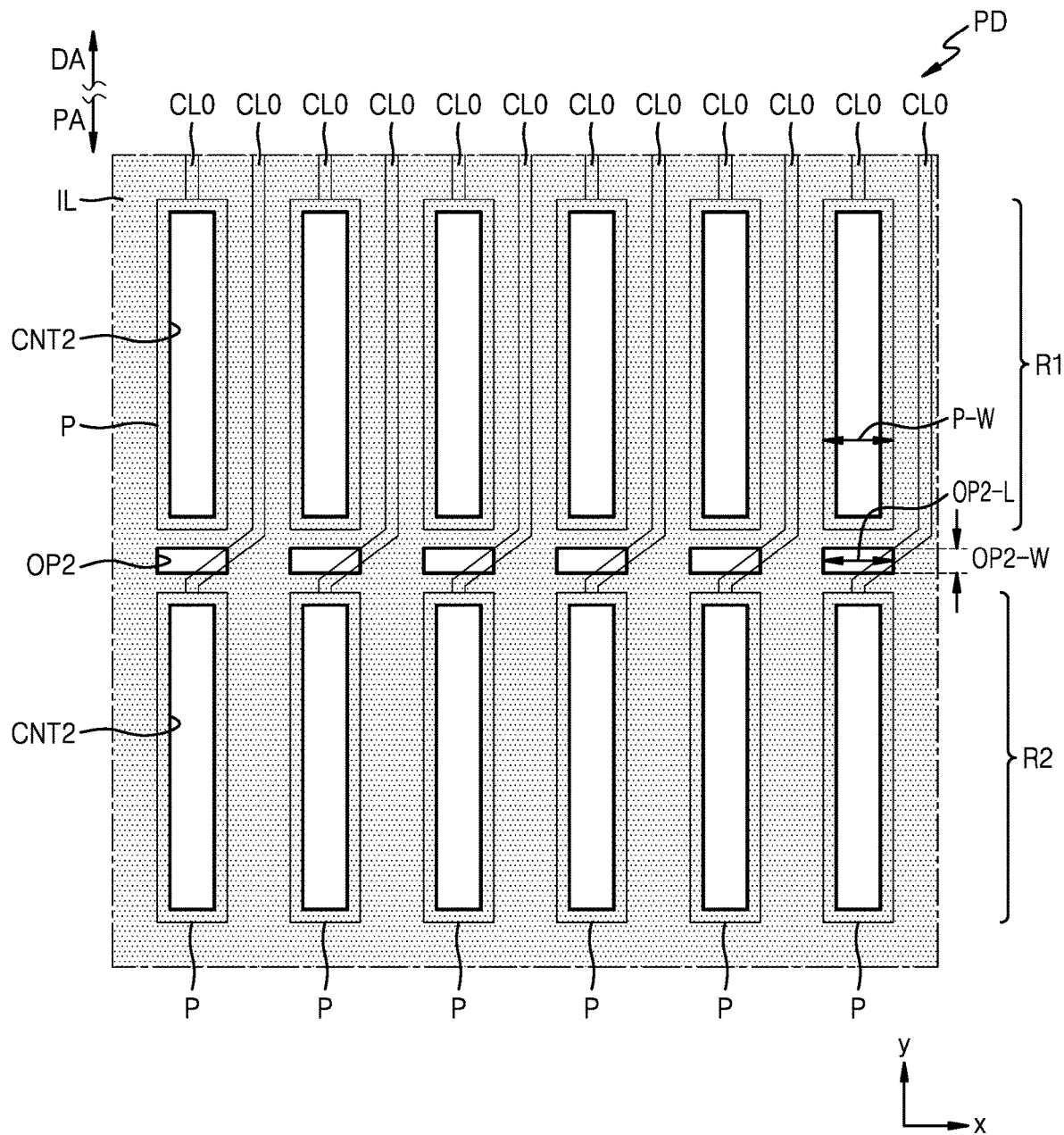

Though it is shown in FIG. 8 that the pad portion PD may include both the first openings OP1 and the second openings OP2, the pad portion PD may include only the second openings OP2 each arranged or disposed between the pads P arranged or disposed in the second direction (for example the y-direction) as shown in FIG. 15 in an embodiment. In FIG. 15, the second openings OP2 may be arranged or disposed to correspond to a region between the pads P on the first row R1 and the pads P on the second row R2. In this case, an opening may not be arranged or disposed between the pads P on the first row R1. The insulating layer IL may be arranged or disposed between the pads P on the first row R1. Similarly, an opening may not be arranged or disposed between the pads P on the second row R2. The insulating layer IL may be arranged or disposed between the pads P on the second row R2.

Figure 16:
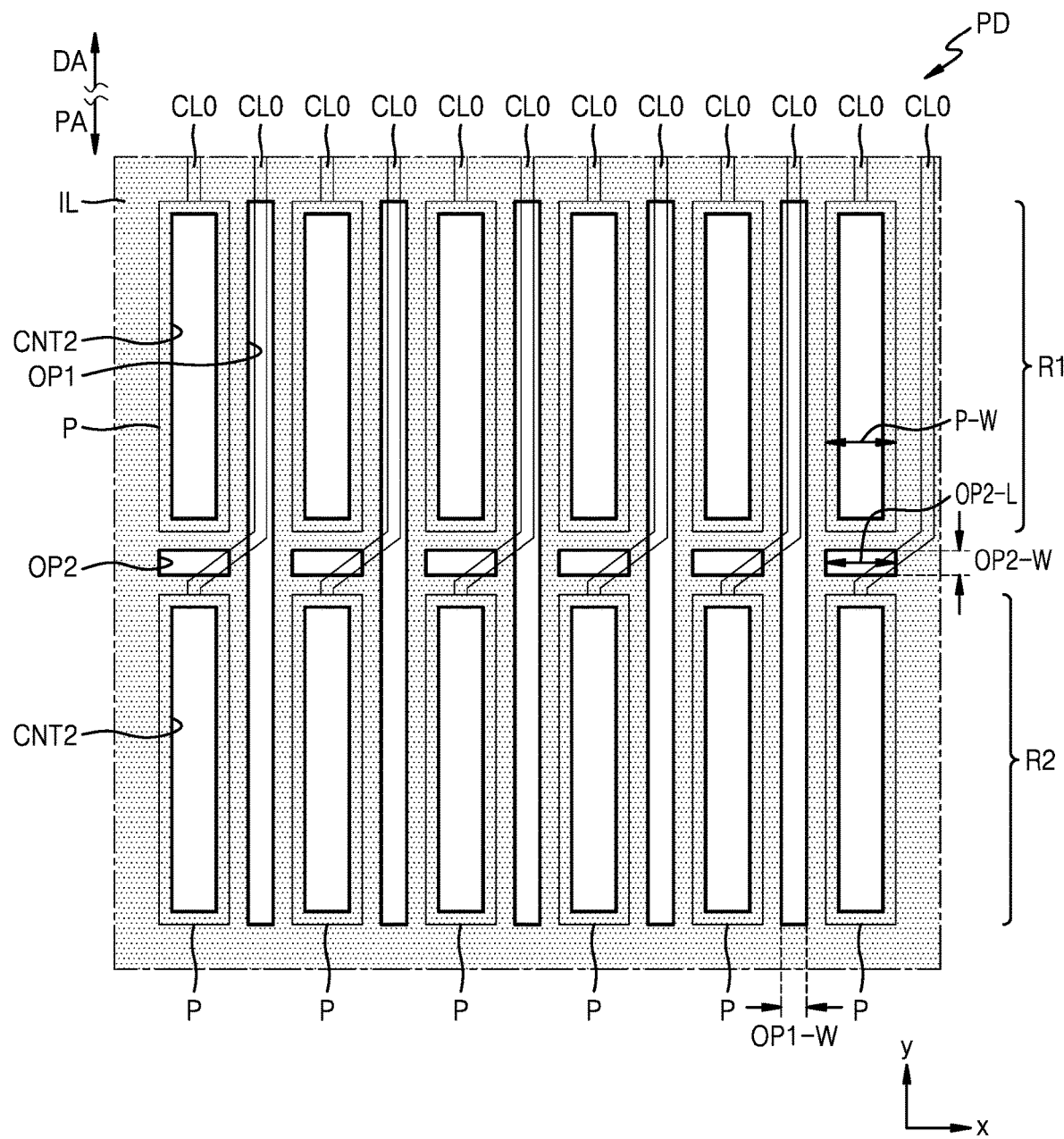

In an embodiment, similar to FIG. 8, the pad portion PD may include the first openings OP1 and the second openings OP2, the first openings OP1 each being arranged or disposed between the pads P arranged or disposed in the first direction (for example the x-direction), and the second openings OP2 being arranged or disposed between the pads P arranged or disposed in the second direction (for example the y-direction). Referring to FIG. 16, the first openings OP1 may extend in the second direction (for example the y-direction) to simultaneously neighbor the pad P on the first row R1 and the pad P on the second row R2. Therefore, in FIG. 16, the length of the first openings OP1 in the second direction (e.g. the y-direction) may be at least twice the length of each pad P.

Figure 12:
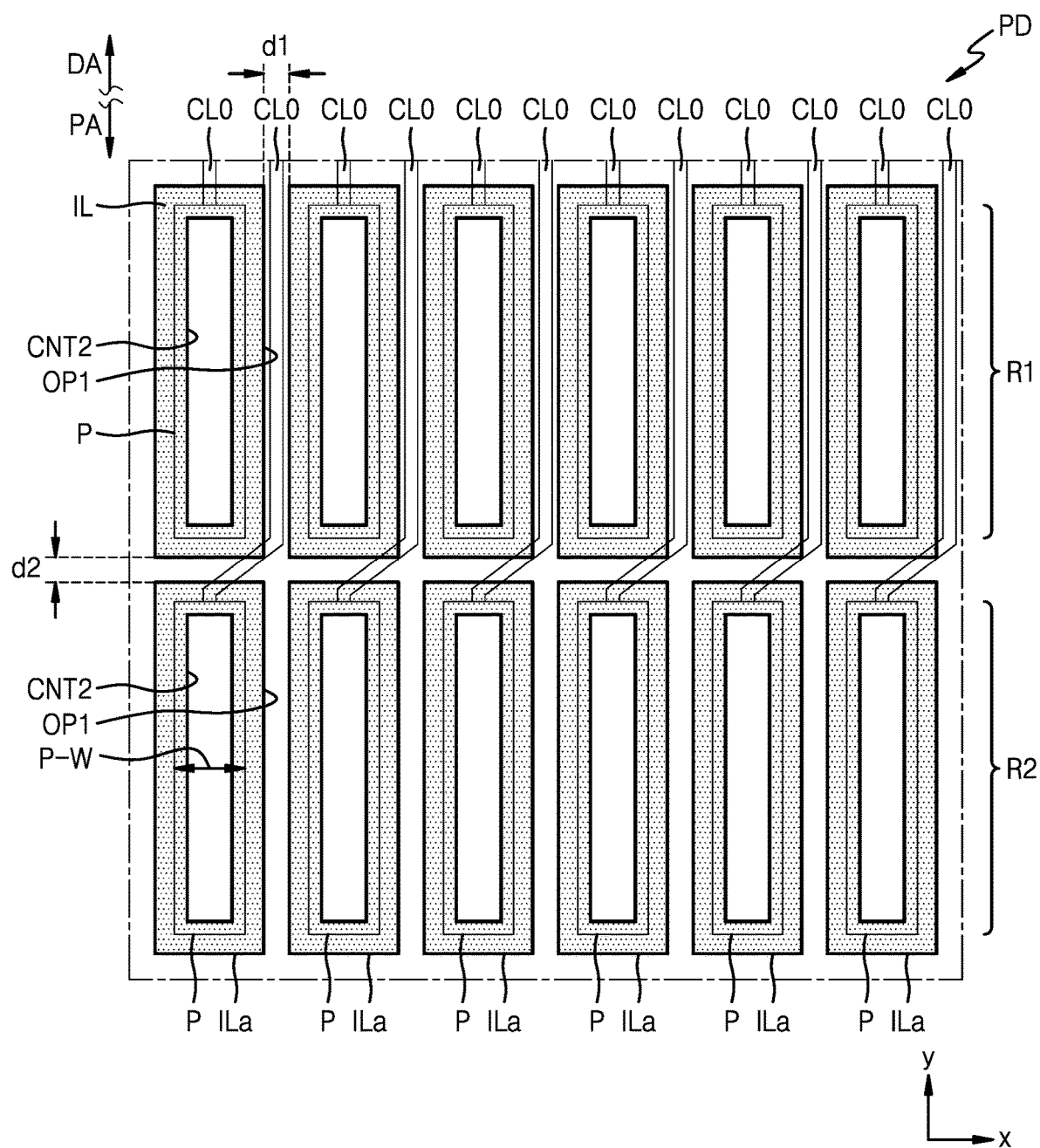
FIGS. 12 to 16 are enlarged plan views of a portion or region of a pad portion in a display apparatus according to an embodiment.
Figure 13:
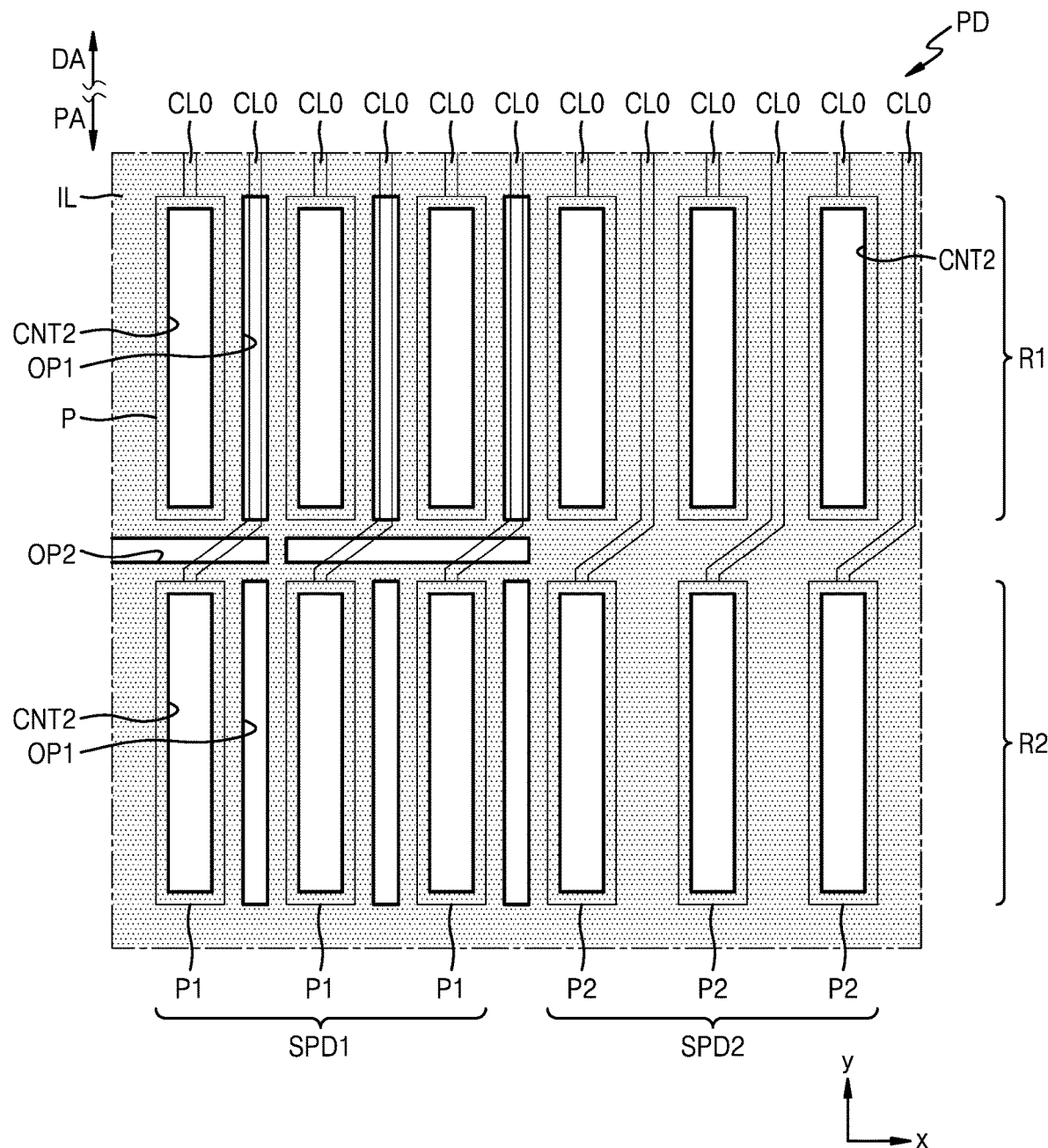
Figure 14:
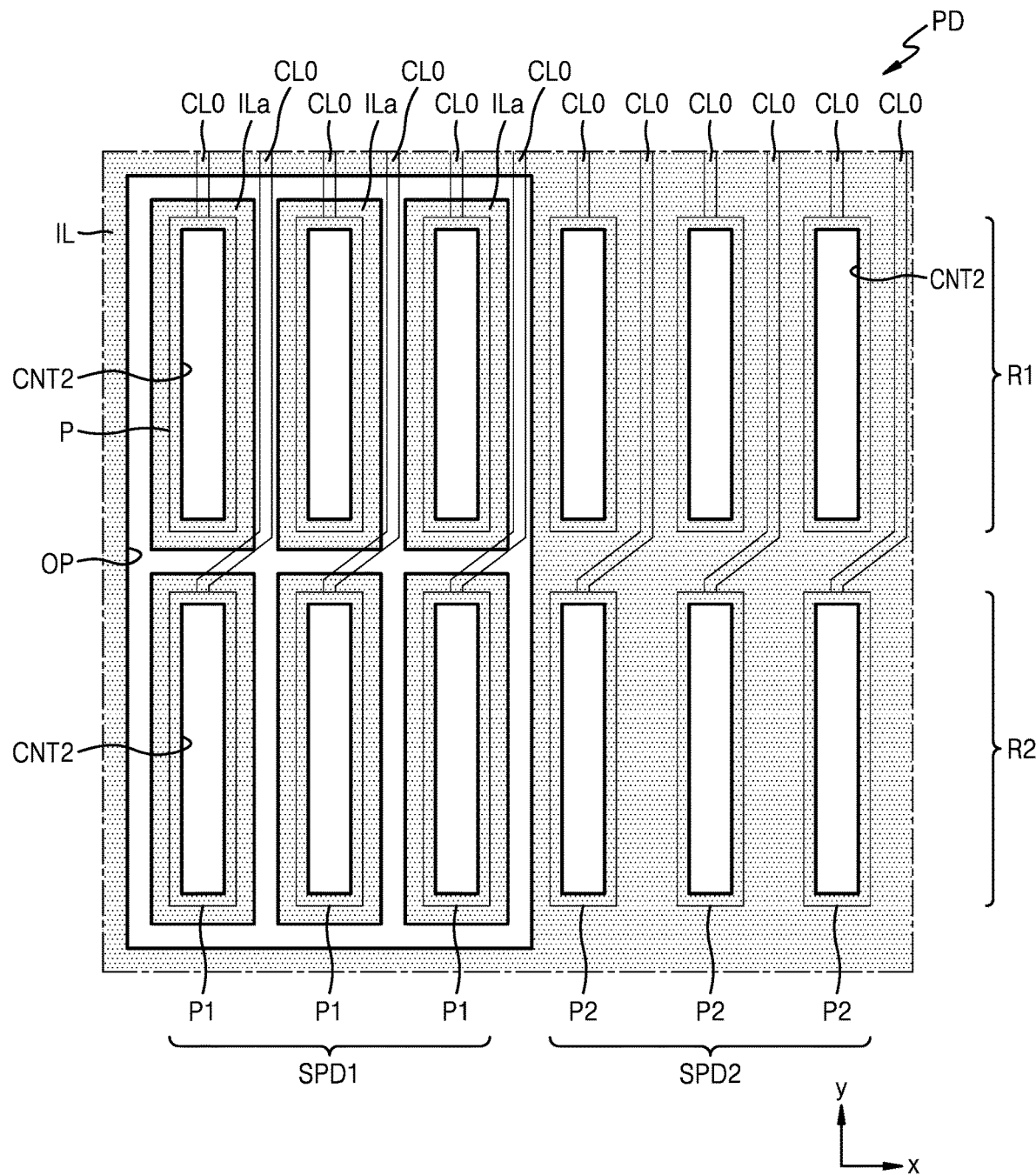

FIGS. 12 to 14 are enlarged plan views of a portion or region of the pad portion PD in the display apparatus 1 according to an embodiment.

Embodiments of FIGS. 12 to 14 may be different from the above embodiments in the shapes of the insulating layer IL and the openings of the insulating layer IL. Because other configurations may be the same as those of the above embodiment, differences are mainly described below.

Referring to FIG. 12, the insulating layer IL may cover or overlap the edge of each of the pads P and may be isolated for each of the pads P. In the above embodiments, because the insulating layer IL may include the openings in the region between the pads, the exfoliation of the insulating layer IL may be prevented from being accelerated by the potential difference between the pads P. In an embodiment, because the openings extend to be connected to each other, the insulating layer IL may have a shape isolated for each of the pads P. Therefore, in an embodiment, because the insulating layer IL may be isolated for each of the pads P and thus a leakage current flowing between the pads P through the insulating layer IL may be completely blocked, the exfoliation of the insulating layer IL may be prevented from being accelerated.

The insulating layer IL may include insulating portions ILa isolated for each of the pads P. Respective insulating portions ILa may be spaced apart from each other between the pads P. In an embodiment, the insulating portions ILa may be spaced apart from each other by a first interval d1 between the pads P arranged or disposed in the first direction (for example the x-direction), and the insulating portions ILa may be spaced apart from each other by a second interval d2 between the pads P arranged or disposed in the second direction (for example the y-direction).

In an embodiment, the first interval d1 may be the same as the second interval d2. For example, the first interval d1 and the second interval d2 may be in a range of about 20% to about 45% of the width P-W of the pad P.

Referring to FIG. 13, the pad portion PD may include the first sub-pad portion SPD1 and the second sub-pad portion SPD2. The first sub-pad portion SPD1 and the second sub-pad portion SPD2 have the same configuration described with reference to FIG. 3A.

The first sub-pad portion SPD1 may include first pads P1 that transfer an electric signal to the display portion 200. As shown in FIG. 3A or 3B, the first pads P1 may be electrically connected to an end terminal of the signal transfer line 151 of the data line DL that may extend to the peripheral area PA.

Some or a predetermined number of the first pads P1 may be electrically connected to the signal transfer lines 121, 131, an 141 and an end terminal of the power transfer line 161, the signal transfer lines 121, 131, and 141 being electrically connected to the first scan driving circuit 120, the second scan driving circuit 130, and the emission control driving circuit 140, and the power transfer line 161 being electrically connected to the first power supply line 160.

The second sub-pad portions SPD2 may be respectively arranged or disposed on two opposite sides with the first sub-pad portion SPD1 therebetween. As shown in FIG. 3A or 3B, the second sub-pad portion SPD2 may include the second pads P2 that transfer an electric signal to the touch sensing layer 400. In an embodiment, the second pads P2 may include dummy pads. Because the second pads P2 may also be formed through the same process of forming the first pads P1, the second pads P2 may have approximately the same shape as the first pads P1. The second pads P2 may be provided as floating electrodes and electrically insulated from the signal lines electrically connected to the pixel PX. The second pads P2 may overlap the pad portion of the touch sensing layer 400.

As described above, the first sub-pad portion SPD1 and the second sub-pad portion SPD2 respectively receive different electric signals depending on their roles. Therefore, potential differences between the first pads P1 and the second pads P2 may also be different. Because a potential difference between the second pads P2 electrically connected to the touch sensing layer 400 may be less than a potential difference between the first pads P1 electrically connected to the display portion 200, a disconnection effect due to the openings formed in the insulating layer IL may be trivial. Therefore, in an embodiment, the first and second openings OP1 and OP2 may be provided or disposed between the first pads P1 of the first sub-pad portion SPD1 in which a potential difference between the pads may be large.

Similar to the above embodiments, the first and second openings OP1 and OP2 may be arranged or disposed between the first pads P1 neighboring each other. Some or a predetermined number of the first and second openings OP1 and OP2 may be arranged or disposed between the first sub-pad portion SPD1 and the second sub-pad portion SPD2.

Similar to FIG. 13, in an embodiment of FIG. 14, the first sub-pad portion SPD1 may be isolated from the second sub-pad portion SPD2 by the opening OP of the insulating layer IL. The opening OP of the insulating layer IL may be provided in a shape surrounding the first pads P1 of the first sub-pad portion SPD1. The insulating layer IL may include insulating portions ILa covering or overlapping the edge of each of the first pads P1 inside the first sub-pad portion SPD1. The insulating portions ILa may be isolated from the insulating layer IL in the outer side covering or overlapping the edge of each of the second pads P2 of the second sub-pad portion SPD2.

Though only the display apparatus 1 is mainly described in the above, an embodiment is not limited thereto. For example, a method of manufacturing the display apparatus 1 also falls within the scope of the disclosure.

According to an embodiment having the above configuration, the display apparatus in which the reliability may be improved in the pad area may be implemented. However, the scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate including:
a display area;
a non-display area adjacent to the display area; and
a pad area arranged in the non-display area;
a display portion arranged in the display area and including pixels;
a pad portion arranged in the pad area and including pads; and
an insulating layer overlapping an edge of each of the pads and exposing a central portion of each of the pads,
wherein the insulating layer includes at least one opening arranged between adjacent ones of the pads and,
the at least one opening includes a first opening extending in a second direction and a second opening extending in a first direction intersecting the second direction.

2. The display apparatus of claim 1, wherein
the pads are arranged in the first direction and the second direction intersecting the first direction, and
the first opening is arranged between the pads arranged in the first direction.

3. The display apparatus of claim 1, wherein
the pads are arranged in the first direction and the second direction intersecting the first direction, and
the second opening is arranged between the pads arranged in the second direction.

4. The display apparatus of claim 2, wherein the insulating layer further includes the second opening arranged between the pads arranged in the second direction.

5. The display apparatus of claim 4, wherein
the first opening has a first length extending in the second direction, and
the first length is the same as a length of each of the pads in the second direction.

6. The display apparatus of claim 4, wherein
the first opening has a first width in the first direction, and
the first width is in a range of about 20% to about 45% of a width of each of the pads in the first direction.

7. The display apparatus of claim 5, wherein
the second opening has a second length extending in the first direction, and
the second length is less than the first length.

8. The display apparatus of claim 6, wherein
the second opening has a second width in the second direction, and
the second width is the same as the first width.

9. The display apparatus of claim 6, wherein
the second opening has a second width in the second direction, and
the second width is different from the first width.

10. The display apparatus of claim 5, wherein
the second opening has a second length extending in the first direction, and
the second length is greater than the first length.

11. The display apparatus of claim 1, further comprising:
a thin-film encapsulation layer arranged on the display portion and including at least one organic encapsulation layer and at least one inorganic encapsulation layer; and
a touch sensing layer arranged on the thin-film encapsulation layer.

12. The display apparatus of claim 11, wherein the pad portion includes:
a first sub-pad portion including first pads that transfer an electric signal to the display portion; and
a second sub-pad portion including second pads that transfer an electric signal to the touch sensing layer.

13. The display apparatus of claim 12, wherein the at least one opening of the insulating layer is arranged except between the second pads of the second sub-pad portion.

14. The display apparatus of claim 1, wherein the insulating layer includes an organic insulating material.

15. The display apparatus of claim 14, wherein a thickness of the insulating layer is in a range of about 6000 Å to about 8000 Å.

16. A display apparatus comprising:
a substrate including:
a display area;
a non-display area adjacent to the display area; and
a pad area arranged in the non-display area;
a display portion arranged in the display area and including pixels;
a pad portion arranged in the pad area and including pads; and
an insulating layer overlapping an edge of each of the pads and exposing a central portion of each of the pads,
wherein the insulating layer includes at least one opening arranged between adjacent ones of the pads, wherein each of the pads includes:
a first conductive layer arranged on the substrate;
a first inorganic insulating layer overlapping the first conductive layer and including a first contact hole exposing at least a portion of the first conductive layer;
a second conductive layer arranged on the first inorganic insulating layer and electrically connected to the first conductive layer through the first contact hole; and
a third conductive layer arranged on the second conductive layer.

17. The display apparatus of claim 16, wherein the insulating layer dads an edge of the third conductive layer.

18. The display apparatus of claim 16, wherein at least a portion of the first inorganic insulating layer is exposed through the at least one opening of the insulating layer.

19. The display apparatus of claim 16, further comprising:
a display element arranged in the display area;
a thin film transistor arranged between the substrate and the display element; and
a connection electrode electrically connecting the display element to the thin film transistor, wherein
the thin film transistor includes:
a semiconductor layer;
a gate electrode at least partially overlapping the semiconductor layer; and
an electrode layer arranged over the gate electrode and electrically connected to the semiconductor layer, and
the third conductive layer and the connection electrode include a same material.

20. The display apparatus of claim 19, wherein
the first conductive layer and the gate electrode include a same material, and the second conductive layer and the electrode layer include a same material.

21. The display apparatus of claim 19, further comprising:
an organic insulating layer arranged between the connection electrode and a pixel electrode of the display element and including a via hole through which the pixel electrode is connected to the connection electrode,
wherein the insulating layer and the organic insulating layer include a same material.

22. The display apparatus of claim 19, wherein
the display element includes a pixel electrode, an opposite electrode, and an intermediate layer arranged between the pixel electrode and the opposite electrode, and
the pixel electrode includes silver (Ag).

23. The display apparatus of claim 16, wherein each of the pads further includes:
a second inorganic insulating layer overlapping the third conductive layer and the insulating layer and including a second contact hole exposing at least a portion of the third conductive layer; and
a fourth conductive layer arranged on the first inorganic insulating layer and electrically connected to the third conductive layer through the second contact hole.

24. The display apparatus of claim 23, further comprising:
a thin-film encapsulation layer arranged on the display portion and including at least one organic encapsulation layer and at least one inorganic encapsulation layer; and
a touch sensing layer arranged on the thin-film encapsulation layer, the touch sensing layer including:
a first touch electrode layer;
a second touch electrode layer on the first touch electrode layer; and
an inorganic layer arranged between the first touch electrode layer and the second touch electrode layer,
wherein the fourth conductive layer and the second touch electrode layer include a same material.

25. A display apparatus comprising:
a substrate including a display area and a peripheral area adjacent to the display area;
a display portion arranged in the display area and including pixels;
a driving circuit portion arranged in the peripheral area and transferring a driving signal to the display portion;
a pad portion arranged in the peripheral area and including pads; and
an insulating layer overlapping an edge of each of the pads and exposing a central portion of each of the pads,
wherein at least a portion of the insulating layer arranged between adjacent ones of the pads is removed, and
the insulating layer includes a first opening extending in second direction and a second opening extending in a first direction intersecting the second direction.

26. The display apparatus of claim 25, wherein the pad portion further includes:
a first sub-pad portion including first pads that transfer an electric signal to the display portion, and
the insulating layer includes at least one first opening arranged between the first pads of the first sub-pad portion.

27. The display apparatus of claim 25, further comprising:
a touch sensing layer arranged on the display portion; and
a second sub-pad portion including second pads that transfer an electric signal to the touch sensing layer,
wherein the insulating layer is arranged between the second pads of the second sub-pad portion.

* * * * *